United States Patent
Olsen et al.

(10) Patent No.: US 8,323,754 B2
(45) Date of Patent: Dec. 4, 2012

(54) STABILIZATION OF HIGH-K DIELECTRIC MATERIALS

(75) Inventors: Christopher Olsen, Fremont, CA (US); Pravin K. Narwankar, Sunnyvale, CA (US); Shreyas S. Kher, Campbell, CA (US); Randhir Thakur, San Jose, CA (US); Shankar Muthukrishnan, San Jose, CA (US); Philip A. Kraus, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 2085 days.

(21) Appl. No.: 10/851,514

(22) Filed: May 21, 2004

(65) Prior Publication Data

US 2005/0260357 A1    Nov. 24, 2005

(51) Int. Cl.
*H05H 1/24* (2006.01)
(52) U.S. Cl. ........................................ 427/578; 427/579
(58) Field of Classification Search .................. 427/578, 427/579
See application file for complete search history.

(56) References Cited

U.S. PATENT DOCUMENTS

| | | | |
|---|---|---|---|
| 4,058,430 A | 11/1977 | Suntola et al. |
| 4,128,670 A | 12/1978 | Gaensslen |
| 4,237,973 A | 12/1980 | Todd |
| 4,389,973 A | 6/1983 | Suntola et al. |
| 4,413,022 A | 11/1983 | Suntola et al. |
| 4,415,275 A | 11/1983 | Dietrich |
| 4,486,487 A | 12/1984 | Skarp |
| 4,693,208 A | 9/1987 | Sakai |
| 4,761,269 A | 8/1988 | Conger et al. |
| 4,834,831 A | 5/1989 | Nishizawa et al. |
| 4,975,252 A | 12/1990 | Nishizawa et al. |
| 4,993,357 A | 2/1991 | Scholz |
| 5,027,746 A | 7/1991 | Frijlink |
| 5,173,327 A | 12/1992 | Sandhu et al. |
| 5,178,681 A | 1/1993 | Moore et al. |

(Continued)

FOREIGN PATENT DOCUMENTS

EP    0 464 515    1/1992

(Continued)

OTHER PUBLICATIONS

Sekine, et al. "Nitrogen profile control by plasma nitridation technique for poly-Si gate HfSiON CMOSFET with excellent interface property and ultra-low leakage current," International Electron Devices Meeting 2003. IEDM. Technical Digest. Washington, DC, Dec. 8-10, 2003, New York, NY, IEEE, US, Dec. 8, 2003, pp. 103-106.*

(Continued)

*Primary Examiner* — Michael Cleveland
*Assistant Examiner* — Robert Vetere
(74) *Attorney, Agent, or Firm* — Patterson & Sheridan, LLP

(57) ABSTRACT

In one embodiment, a method for forming a dielectric stack on a substrate is provided which includes depositing a first layer of a dielectric material on a substrate surface, exposing the first layer to a nitridation process, depositing a second layer of the dielectric material on the first layer, exposing the second layer to the nitridation process, and exposing the substrate to an anneal process. In another embodiment, a method for forming a dielectric material on a substrate is provided which includes depositing a metal oxide layer substantially free of silicon on a substrate surface, exposing the metal oxide layer to a nitridation process, and exposing the substrate to an anneal process.

6 Claims, 4 Drawing Sheets

U.S. PATENT DOCUMENTS

| | | |
|---|---|---|
| 5,225,366 A | 7/1993 | Yoder |
| 5,261,959 A | 11/1993 | Gasworth |
| 5,281,274 A | 1/1994 | Yoder |
| 5,290,609 A | 3/1994 | Horiike et al. |
| 5,294,286 A | 3/1994 | Nishizawa et al. |
| 5,306,666 A | 4/1994 | Izumi |
| 5,338,362 A | 8/1994 | Imahashi |
| 5,374,570 A | 12/1994 | Nasu et al. |
| 5,441,703 A | 8/1995 | Jurgensen |
| 5,443,647 A | 8/1995 | Aucoin et al. |
| 5,480,818 A | 1/1996 | Matsumoto et al. |
| 5,483,919 A | 1/1996 | Yokoyama et al. |
| 5,503,875 A | 4/1996 | Imai et al. |
| 5,521,126 A | 5/1996 | Okamura et al. |
| 5,526,244 A | 6/1996 | Bishop |
| 5,674,786 A | 10/1997 | Turner et al. |
| 5,711,811 A | 1/1998 | Suntola et al. |
| 5,730,802 A | 3/1998 | Ishizumi et al. |
| 5,796,116 A | 8/1998 | Nakata et al. |
| 5,807,792 A | 9/1998 | Ilg et al. |
| 5,835,677 A | 11/1998 | Li et al. |
| 5,855,680 A | 1/1999 | Soininen et al. |
| 5,879,459 A | 3/1999 | Gadgil et al. |
| 5,916,365 A | 6/1999 | Sherman |
| 5,923,056 A | 7/1999 | Lee et al. |
| 5,972,430 A | 10/1999 | DiMeo, Jr. et al. |
| 5,994,240 A | 11/1999 | Thakur |
| 6,013,553 A | 1/2000 | Wallace et al. |
| 6,015,590 A | 1/2000 | Suntola et al. |
| 6,015,917 A | 1/2000 | Bhandari et al. |
| 6,020,243 A | 2/2000 | Wallace et al. |
| 6,025,627 A | 2/2000 | Forbes et al. |
| 6,037,273 A | 3/2000 | Gronet et al. |
| 6,042,652 A | 3/2000 | Hyun et al. |
| 6,043,177 A | 3/2000 | Falconer et al. |
| 6,060,755 A | 5/2000 | Ma et al. |
| 6,071,572 A | 6/2000 | Mosely et al. |
| 6,084,302 A | 7/2000 | Sandhu |
| 6,124,158 A | 9/2000 | Dautartas et al. |
| 6,136,654 A * | 10/2000 | Kraft et al. ............... 438/287 |
| 6,139,700 A | 10/2000 | Kang et al. |
| 6,143,659 A | 11/2000 | Leem |
| 6,144,060 A | 11/2000 | Park et al. |
| 6,174,377 B1 | 1/2001 | Doering et al. |
| 6,174,809 B1 | 1/2001 | Kang et al. |
| 6,183,563 B1 | 2/2001 | Choi et al. |
| 6,197,683 B1 | 3/2001 | Kang et al. |
| 6,200,893 B1 | 3/2001 | Sneh |
| 6,203,613 B1 | 3/2001 | Gates et al. |
| 6,207,302 B1 | 3/2001 | Sugiura et al. |
| 6,207,487 B1 | 3/2001 | Kim et al. |
| 6,231,672 B1 | 5/2001 | Choi et al. |
| 6,238,734 B1 | 5/2001 | Senzaki et al. |
| 6,270,572 B1 | 8/2001 | Kim et al. |
| 6,284,646 B1 | 9/2001 | Leem |
| 6,287,965 B1 | 9/2001 | Kang et al. |
| 6,291,283 B1 | 9/2001 | Wilk |
| 6,291,867 B1 * | 9/2001 | Wallace et al. ............ 257/410 |
| 6,297,539 B1 | 10/2001 | Ma et al. |
| 6,299,294 B1 | 10/2001 | Regan |
| 6,302,965 B1 | 10/2001 | Umotoy et al. |
| 6,305,314 B1 | 10/2001 | Sneh et al. |
| 6,306,216 B1 | 10/2001 | Kim et al. |
| 6,335,240 B1 | 1/2002 | Kim et al. |
| 6,342,277 B1 | 1/2002 | Sherman |
| 6,348,376 B2 | 2/2002 | Lim et al. |
| 6,348,386 B1 | 2/2002 | Gilmer |
| 6,358,829 B2 | 3/2002 | Yoon et al. |
| 6,372,598 B2 | 4/2002 | Kang et al. |
| 6,379,748 B1 | 4/2002 | Bhandari et al. |
| 6,391,785 B1 | 5/2002 | Satta et al. |
| 6,391,803 B1 | 5/2002 | Kim et al. |
| 6,395,650 B1 | 5/2002 | Callegari et al. |
| 6,399,208 B1 | 6/2002 | Baum et al. |
| 6,399,491 B2 | 6/2002 | Jeon et al. |
| 6,416,577 B1 | 7/2002 | Suntoloa et al. |
| 6,416,822 B1 | 7/2002 | Chiang et al. |
| 6,420,279 B1 | 7/2002 | Ono et al. |
| 6,423,619 B1 | 7/2002 | Grant et al. |
| 6,428,859 B1 | 8/2002 | Chiang et al. |
| 6,444,592 B1 | 9/2002 | Ballantine et al. |
| 6,447,607 B2 | 9/2002 | Soininen et al. |
| 6,451,119 B2 | 9/2002 | Sneh et al. |
| 6,451,695 B2 | 9/2002 | Sneh |
| 6,452,229 B1 | 9/2002 | Krivokapic |
| 6,458,701 B1 | 10/2002 | Chae et al. |
| 6,462,367 B2 | 10/2002 | Marsh et al. |
| 6,468,924 B2 | 10/2002 | Lee et al. |
| 6,475,276 B1 | 11/2002 | Elers et al. |
| 6,475,910 B1 | 11/2002 | Sneh |
| 6,478,872 B1 | 11/2002 | Chae et al. |
| 6,481,945 B1 | 11/2002 | Hasper et al. |
| 6,482,262 B1 | 11/2002 | Elers et al. |
| 6,482,733 B2 | 11/2002 | Raaijmakers et al. |
| 6,489,214 B2 | 12/2002 | Kim et al. |
| 6,492,283 B2 | 12/2002 | Raaijmakers et al. |
| 6,511,539 B1 | 1/2003 | Raaijmakers |
| 6,524,934 B1 | 2/2003 | Lorimer |
| 6,534,395 B2 | 3/2003 | Werkhoven et al. |
| 6,548,424 B2 | 4/2003 | Putkonen |
| 6,551,406 B2 | 4/2003 | Kilpi |
| 6,551,929 B1 | 4/2003 | Kori et al. |
| 6,569,501 B2 | 5/2003 | Chiang et al. |
| 6,572,705 B1 | 6/2003 | Suntola et al. |
| 6,578,287 B2 | 6/2003 | Aswad |
| 6,579,372 B2 | 6/2003 | Park |
| 6,585,823 B1 | 7/2003 | Van Wijck |
| 6,593,484 B2 | 7/2003 | Yasuhara et al. |
| 6,599,572 B2 | 7/2003 | Saanila et al. |
| 6,607,973 B1 | 8/2003 | Jeon |
| 6,607,976 B2 | 8/2003 | Chen et al. |
| 6,613,695 B2 | 9/2003 | Pomarede et al. |
| 6,620,670 B2 | 9/2003 | Song et al. |
| 6,620,723 B1 | 9/2003 | Byun et al. |
| 6,630,030 B1 | 10/2003 | Suntola et al. |
| 6,630,201 B2 | 10/2003 | Chiang et al. |
| 6,630,413 B2 | 10/2003 | Todd |
| 6,632,279 B1 | 10/2003 | Ritala et al. |
| 6,632,747 B2 | 10/2003 | Niimi et al. |
| 6,660,126 B2 | 12/2003 | Nguyen et al. |
| 6,660,660 B2 | 12/2003 | Haukka et al. |
| 6,674,138 B1 | 1/2004 | Halliyal et al. |
| 6,686,271 B2 | 2/2004 | Raaijmakers et al. |
| 6,716,287 B1 | 4/2004 | Santiago et al. |
| 6,718,126 B2 | 4/2004 | Lei |
| 6,734,020 B2 | 5/2004 | Yang et al. |
| 6,772,072 B2 | 8/2004 | Ganguli et al. |
| 6,773,507 B2 | 8/2004 | Jallepally et al. |
| 6,777,352 B2 | 8/2004 | Tepman et al. |
| 6,778,762 B1 | 8/2004 | Shareef et al. |
| 6,803,272 B1 | 10/2004 | Halliyal et al. |
| 6,809,370 B1 | 10/2004 | Colombo et al. |
| 6,815,285 B2 | 11/2004 | Choi et al. |
| 6,818,094 B2 | 11/2004 | Yudovsky |
| 6,821,563 B2 | 11/2004 | Yudovsky |
| 6,866,746 B2 | 3/2005 | Lei et al. |
| 6,868,859 B2 | 3/2005 | Yudovsky |
| 6,881,437 B2 | 4/2005 | Ivanov et al. |
| 6,884,719 B2 | 4/2005 | Chang et al. |
| 6,902,624 B2 | 6/2005 | Seidel et al. |
| 6,921,062 B2 | 7/2005 | Gregg et al. |
| 7,037,816 B2 | 5/2006 | Lin et al. |
| 7,037,863 B2 * | 5/2006 | Doh et al. .................. 438/785 |
| 7,151,039 B2 * | 12/2006 | Lee et al. .................. 438/396 |
| 2001/0000866 A1 | 5/2001 | Sneh et al. |
| 2001/0002280 A1 | 5/2001 | Sneh |
| 2001/0009140 A1 | 7/2001 | Bondestam et al. |
| 2001/0009695 A1 | 7/2001 | Saanila et al. |
| 2001/0011526 A1 | 8/2001 | Doering et al. |
| 2001/0013312 A1 | 8/2001 | Soininen et al. |
| 2001/0014371 A1 | 8/2001 | Kilpi |
| 2001/0021589 A1 | 9/2001 | Wilk |
| 2001/0024387 A1 | 9/2001 | Raaijmakers et al. |
| 2001/0024871 A1 | 9/2001 | Yagi |
| 2001/0025979 A1 | 10/2001 | Kim et al. |
| 2001/0028924 A1 | 10/2001 | Sherman |
| 2001/0029092 A1 | 10/2001 | Park et al. |

| Publication No. | Date | Inventor |
|---|---|---|
| 2001/0029891 A1 | 10/2001 | Oh et al. |
| 2001/0034123 A1 | 10/2001 | Jeon et al. |
| 2001/0041250 A1 | 11/2001 | Werkhoven et al. |
| 2001/0042523 A1 | 11/2001 | Kesala |
| 2001/0042799 A1 | 11/2001 | Kim et al. |
| 2001/0048907 A1 | 12/2001 | Ohmi et al. |
| 2001/0050039 A1 | 12/2001 | Park |
| 2001/0054377 A1 | 12/2001 | Lindfors et al. |
| 2001/0054730 A1 | 12/2001 | Kim et al. |
| 2001/0054769 A1 | 12/2001 | Raaijmakers et al. |
| 2002/0000196 A1 | 1/2002 | Park |
| 2002/0000598 A1 | 1/2002 | Kang et al. |
| 2002/0005556 A1 | 1/2002 | Cartier et al. |
| 2002/0007790 A1 | 1/2002 | Park et al. |
| 2002/0008297 A1 | 1/2002 | Park et al. |
| 2002/0009544 A1 | 1/2002 | McFeely et al. |
| 2002/0009896 A1 | 1/2002 | Sandhu et al. |
| 2002/0014647 A1 | 2/2002 | Seidl et al. |
| 2002/0015790 A1 | 2/2002 | Baum et al. |
| 2002/0016084 A1 | 2/2002 | Todd et al. |
| 2002/0017242 A1 | 2/2002 | Hamaguchi et al. |
| 2002/0020869 A1 | 2/2002 | Park et al. |
| 2002/0021544 A1 | 2/2002 | Cho et al. |
| 2002/0029092 A1 | 3/2002 | Gass |
| 2002/0031618 A1 | 3/2002 | Sherman |
| 2002/0041931 A1 | 4/2002 | Suntola et al. |
| 2002/0043666 A1 | 4/2002 | Parsons et al. |
| 2002/0047151 A1 | 4/2002 | Kim et al. |
| 2002/0048635 A1 | 4/2002 | Kim et al. |
| 2002/0052097 A1 | 5/2002 | Park |
| 2002/0055270 A1 | 5/2002 | Narwankar et al. |
| 2002/0064970 A1 | 5/2002 | Chooi et al. |
| 2002/0066411 A1 | 6/2002 | Chiang et al. |
| 2002/0068458 A1 | 6/2002 | Chiang et al. |
| 2002/0073924 A1 | 6/2002 | Chiang et al. |
| 2002/0074588 A1 | 6/2002 | Lee |
| 2002/0076481 A1 | 6/2002 | Chiang et al. |
| 2002/0076507 A1 | 6/2002 | Chiang et al. |
| 2002/0076508 A1 | 6/2002 | Chiang et al. |
| 2002/0076837 A1 | 6/2002 | Hujanen et al. |
| 2002/0081826 A1 | 6/2002 | Rotondaro et al. |
| 2002/0081844 A1 | 6/2002 | Jeon et al. |
| 2002/0086106 A1 | 7/2002 | Park et al. |
| 2002/0086111 A1 | 7/2002 | Byun et al. |
| 2002/0092471 A1 | 7/2002 | Kang et al. |
| 2002/0093046 A1 | 7/2002 | Moriya et al. |
| 2002/0093781 A1 | 7/2002 | Bachhofer et al. |
| 2002/0094689 A1 | 7/2002 | Park |
| 2002/0098627 A1 | 7/2002 | Pomarede et al. |
| 2002/0104481 A1 | 8/2002 | Chiang et al. |
| 2002/0106451 A1 | 8/2002 | Skarp et al. |
| 2002/0106536 A1 | 8/2002 | Lee et al. |
| 2002/0106846 A1 | 8/2002 | Seutter et al. |
| 2002/0108570 A1 | 8/2002 | Lindfors |
| 2002/0110991 A1 | 8/2002 | Li |
| 2002/0115252 A1 | 8/2002 | Haukka et al. |
| 2002/0115886 A1 | 8/2002 | Yasuhara et al. |
| 2002/0117399 A1 | 8/2002 | Chen et al. |
| 2002/0121241 A1 | 9/2002 | Nguyen et al. |
| 2002/0121342 A1 | 9/2002 | Lu et al. |
| 2002/0127745 A1 | 9/2002 | Lu et al. |
| 2002/0134307 A1 | 9/2002 | Choi |
| 2002/0135071 A1 | 9/2002 | Kang et al. |
| 2002/0144655 A1 | 10/2002 | Chiang et al. |
| 2002/0144657 A1 | 10/2002 | Chiang et al. |
| 2002/0146511 A1 | 10/2002 | Chiang et al. |
| 2002/0146895 A1 | 10/2002 | Ramdani et al. |
| 2002/0151152 A1 | 10/2002 | Shimamoto et al. |
| 2002/0151154 A1 | 10/2002 | Yamazaki et al. |
| 2002/0153579 A1 | 10/2002 | Yamamoto |
| 2002/0155722 A1 | 10/2002 | Satta et al. |
| 2002/0162506 A1 | 11/2002 | Sneh et al. |
| 2002/0164421 A1 | 11/2002 | Chiang et al. |
| 2002/0164423 A1 | 11/2002 | Chiang et al. |
| 2002/0172768 A1 | 11/2002 | Endo et al. |
| 2002/0173130 A1 | 11/2002 | Pomarede et al. |
| 2002/0175393 A1 | 11/2002 | Baum et al. |
| 2002/0177282 A1 | 11/2002 | Song |
| 2002/0182320 A1 | 12/2002 | Leskela et al. |
| 2002/0187256 A1 | 12/2002 | Elers et al. |
| 2002/0187631 A1 | 12/2002 | Kim et al. |
| 2002/0195643 A1 | 12/2002 | Harada |
| 2002/0196591 A1 | 12/2002 | Hujanen et al. |
| 2002/0197402 A1 | 12/2002 | Chiang et al. |
| 2002/0197863 A1 | 12/2002 | Mak et al. |
| 2002/0197881 A1 | 12/2002 | Ramdani et al. |
| 2002/0197883 A1 | 12/2002 | Niimi et al. |
| 2003/0004723 A1 | 1/2003 | Chihara |
| 2003/0010451 A1 | 1/2003 | Tzu et al. |
| 2003/0013300 A1 | 1/2003 | Byun |
| 2003/0013320 A1 | 1/2003 | Kim et al. |
| 2003/0015764 A1 | 1/2003 | Raaijmakers et al. |
| 2003/0017697 A1 | 1/2003 | Choi et al. |
| 2003/0022338 A1 | 1/2003 | Ruben et al. |
| 2003/0031807 A1 | 2/2003 | Elers et al. |
| 2003/0032281 A1 | 2/2003 | Werkhoven et al. |
| 2003/0042630 A1 | 3/2003 | Babcoke et al. |
| 2003/0049931 A1 | 3/2003 | Disney |
| 2003/0049942 A1 | 3/2003 | Byun et al. |
| 2003/0053799 A1 | 3/2003 | Lei |
| 2003/0054631 A1 | 3/2003 | Raaijmakers et al. |
| 2003/0057526 A1 | 3/2003 | Chung et al. |
| 2003/0057527 A1 | 3/2003 | Chung et al. |
| 2003/0059538 A1 | 3/2003 | Chung et al. |
| 2003/0060057 A1 | 3/2003 | Raaijmakers et al. |
| 2003/0068437 A1 | 4/2003 | Nakamura et al. |
| 2003/0072884 A1 | 4/2003 | Zhan et al. |
| 2003/0072913 A1 | 4/2003 | Chou et al. |
| 2003/0072975 A1 | 4/2003 | Shero et al. |
| 2003/0075273 A1 | 4/2003 | Kilpela et al. |
| 2003/0075925 A1 | 4/2003 | Lindfors et al. |
| 2003/0079686 A1 | 5/2003 | Chen et al. |
| 2003/0082296 A1 | 5/2003 | Elers et al. |
| 2003/0082300 A1 | 5/2003 | Todd et al. |
| 2003/0082301 A1 | 5/2003 | Chen et al. |
| 2003/0082307 A1 | 5/2003 | Chung et al. |
| 2003/0089308 A1 | 5/2003 | Raaijmakers et al. |
| 2003/0089942 A1 | 5/2003 | Bhattacharyya |
| 2003/0096473 A1 | 5/2003 | Shih et al. |
| 2003/0101927 A1 | 6/2003 | Raaijmakers et al. |
| 2003/0101938 A1 | 6/2003 | Ronsse et al. |
| 2003/0104710 A1 | 6/2003 | Visokay et al. |
| 2003/0106490 A1 | 6/2003 | Jallepally et al. |
| 2003/0108674 A1 | 6/2003 | Chung et al. |
| 2003/0109114 A1 | 6/2003 | Niwa |
| 2003/0113187 A1 | 6/2003 | Lei et al. |
| 2003/0116087 A1 | 6/2003 | Nguyen et al. |
| 2003/0116804 A1 | 6/2003 | Visokay et al. |
| 2003/0121469 A1 | 7/2003 | Lindfors et al. |
| 2003/0121608 A1 | 7/2003 | Chen et al. |
| 2003/0124262 A1 | 7/2003 | Chen et al. |
| 2003/0129826 A1 | 7/2003 | Werkhoven et al. |
| 2003/0133861 A1 | 7/2003 | Bowen et al. |
| 2003/0134508 A1 | 7/2003 | Raaijmakers et al. |
| 2003/0140854 A1 | 7/2003 | Kilpi |
| 2003/0143328 A1 | 7/2003 | Chen et al. |
| 2003/0143747 A1 | 7/2003 | Bondestam et al. |
| 2003/0143839 A1 | 7/2003 | Raaijmakers et al. |
| 2003/0143841 A1 | 7/2003 | Yang et al. |
| 2003/0160277 A1 | 8/2003 | Bhattacharyya |
| 2003/0165615 A1 | 9/2003 | Aaltonen et al. |
| 2003/0168750 A1 | 9/2003 | Basceri et al. |
| 2003/0172872 A1 | 9/2003 | Thakur et al. |
| 2003/0173586 A1 | 9/2003 | Moriwaki et al. |
| 2003/0185980 A1 | 10/2003 | Endo |
| 2003/0186495 A1 | 10/2003 | Saanila et al. |
| 2003/0186561 A1 | 10/2003 | Law et al. |
| 2003/0188682 A1 | 10/2003 | Tois et al. |
| 2003/0189232 A1 | 10/2003 | Law et al. |
| 2003/0190423 A1 | 10/2003 | Yang et al. |
| 2003/0190497 A1 | 10/2003 | Yang et al. |
| 2003/0190804 A1 | 10/2003 | Glenn et al. |
| 2003/0194493 A1 | 10/2003 | Chang et al. |
| 2003/0194853 A1 | 10/2003 | Jeon |
| 2003/0198754 A1 | 10/2003 | Xi et al. |
| 2003/0205729 A1 | 11/2003 | Basceri et al. |
| 2003/0213560 A1 | 11/2003 | Wang et al. |
| 2003/0213987 A1 | 11/2003 | Basceri et al. |

| | | | | | | |
|---|---|---|---|---|---|---|
| 2003/0215570 | A1 | 11/2003 | Seutter et al. | EP | 1167569 A1 | 1/2002 |
| 2003/0216981 | A1 | 11/2003 | Tillman | EP | 1170804 A2 | 1/2002 |
| 2003/0219942 | A1 | 11/2003 | Choi et al. | EP | 1 321 973 | 6/2003 |
| 2003/0221780 | A1 | 12/2003 | Lei et al. | EP | 1321973 | 6/2003 |
| 2003/0224107 | A1 | 12/2003 | Lindfors et al. | GB | 2 355 727 A | 10/2000 |
| 2003/0224578 | A1 | 12/2003 | Chung et al. | JP | 58-098917 | 6/1983 |
| 2003/0224600 | A1 | 12/2003 | Cao et al. | JP | 64-082671 | 3/1989 |
| 2003/0227033 | A1 | 12/2003 | Ahn et al. | JP | 01-143221 | 6/1989 |
| 2003/0232501 | A1 | 12/2003 | Kher et al. | JP | 02-014513 | 1/1990 |
| 2003/0232506 | A1 | 12/2003 | Metzner et al. | JP | 02-230690 | 9/1990 |
| 2003/0232511 | A1 | 12/2003 | Metzner et al. | JP | 02-246161 | 9/1990 |
| 2003/0232554 | A1 | 12/2003 | Blum et al. | JP | 03-234025 | 10/1991 |
| 2003/0234417 | A1 | 12/2003 | Raaijmakers et al. | JP | 04-291916 | 10/1992 |
| 2003/0235961 | A1 | 12/2003 | Metzner et al. | JP | 05-029228 | 2/1993 |
| 2004/0005749 | A1 | 1/2004 | Choi et al. | JP | 05-047666 | 2/1993 |
| 2004/0007747 | A1 | 1/2004 | Visokay et al. | JP | 05-074724 | 3/1993 |
| 2004/0009307 | A1 | 1/2004 | Koh et al. | JP | 05-206036 | 8/1993 |
| 2004/0009675 | A1 | 1/2004 | Eissa et al. | JP | 05-234899 | 9/1993 |
| 2004/0011404 | A1 | 1/2004 | Ku et al. | JP | 05-251339 | 9/1993 |
| 2004/0011504 | A1 | 1/2004 | Ku et al. | JP | 05-270997 | 10/1993 |
| 2004/0013577 | A1 | 1/2004 | Ganguli et al. | JP | 06-177381 | 6/1994 |
| 2004/0013803 | A1 | 1/2004 | Chung et al. | JP | 06-196809 | 7/1994 |
| 2004/0014320 | A1 | 1/2004 | Chen et al. | JP | 06-224138 | 8/1994 |
| 2004/0015300 | A1 | 1/2004 | Ganguli et al. | JP | 06-230421 | 8/1994 |
| 2004/0016404 | A1 | 1/2004 | Gregg et al. | JP | 07-086269 | 3/1995 |
| 2004/0016973 | A1 | 1/2004 | Rotondaro et al. | JP | 07-300649 | 11/1995 |
| 2004/0018304 | A1 | 1/2004 | Chung et al. | JP | 11-269652 | 10/1999 |
| 2004/0018723 | A1 | 1/2004 | Byun et al. | JP | 2000-031387 | 1/2000 |
| 2004/0018747 | A1 | 1/2004 | Lee et al. | JP | 2000-058777 | 2/2000 |
| 2004/0023461 | A1 | 2/2004 | Ahn et al. | JP | 2000-212752 | 8/2000 |
| 2004/0023462 | A1 | 2/2004 | Rotondaro et al. | JP | 2000-319772 | 11/2000 |
| 2004/0025370 | A1 | 2/2004 | Guenther | JP | 2001-020075 | 1/2001 |
| 2004/0028952 | A1 | 2/2004 | Cartier et al. | JP | 10-308283 | 3/2001 |
| 2004/0029321 | A1 | 2/2004 | Ang et al. | JP | 2001-220294 | 8/2001 |
| 2004/0033698 | A1 | 2/2004 | Lee et al. | JP | 2001-254181 | 9/2001 |
| 2004/0036111 | A1 | 2/2004 | Nishikawa et al. | JP | 2001-328900 | 11/2001 |
| 2004/0036150 | A1 | 2/2004 | Smith et al. | JP | 2002-060944 | 2/2002 |
| 2004/0038554 | A1 | 2/2004 | Ahn et al. | JP | 2002-69641 | 3/2002 |
| 2004/0040501 | A1 | 3/2004 | Vaartstra | JP | 2002-93804 | 3/2002 |
| 2004/0043149 | A1 | 3/2004 | Gordon et al. | JP | 2002-167672 | 6/2002 |
| 2004/0043569 | A1 | 3/2004 | Ahn et al. | JP | 2002-172767 | 6/2002 |
| 2004/0043630 | A1 | 3/2004 | Vaartstra et al. | JP | 2001-111000 | 12/2002 |
| 2004/0046197 | A1 | 3/2004 | Basceri et al. | JP | 2001-172767 | 10/2003 |
| 2004/0048491 | A1 | 3/2004 | Jung et al. | WO | WO 96/17107 | 6/1996 |
| 2004/0051152 | A1 | 3/2004 | Nakajima | WO | WO 99/01595 | 1/1999 |
| 2004/0053484 | A1 | 3/2004 | Nakaya et al. | WO | WO 99/29924 | 6/1999 |
| 2004/0065255 | A1 | 4/2004 | Yang et al. | WO | WO 99/65064 | 12/1999 |
| 2004/0069227 | A1 | 4/2004 | Ku et al. | WO | WO 00/13235 | 3/2000 |
| 2004/0071897 | A1 | 4/2004 | Verplancken et al. | WO | WO 00/15865 | 3/2000 |
| 2004/0077182 | A1 | 4/2004 | Lim et al. | WO | WO 00/16377 | 3/2000 |
| 2004/0144308 | A1 | 7/2004 | Yudovsky | WO | WO 00/54320 | 9/2000 |
| 2004/0144311 | A1 | 7/2004 | Chen et al. | WO | WO 00/63957 | 10/2000 |
| 2004/0168627 | A1 | 9/2004 | Conley, Jr. et al. | WO | WO 00/70674 | 11/2000 |
| 2004/0203254 | A1 | 10/2004 | Conley, Jr. et al. | WO | WO 00/79576 A1 | 12/2000 |
| 2004/0216670 | A1 | 11/2004 | Gutsche et al. | WO | WO 01/15220 A1 | 3/2001 |
| 2004/0219784 | A1 | 11/2004 | Kang et al. | WO | WO 01/17692 A1 | 3/2001 |
| 2004/0224506 | A1 | 11/2004 | Choi et al. | WO | WO 01/25502 A1 | 4/2001 |
| 2004/0229475 | A1 | 11/2004 | Bevan et al. | WO | WO 01/27346 A1 | 4/2001 |
| 2004/0235285 | A1 | 11/2004 | Kang et al. | WO | WO 01/27347 A1 | 4/2001 |
| 2005/0006799 | A1 | 1/2005 | Gregg et al. | WO | WO 01/29280 A1 | 4/2001 |
| 2005/0059240 | A1 | 3/2005 | Choi et al. | WO | WO 01/29891 A1 | 4/2001 |
| 2005/0064207 | A1 | 3/2005 | Senzaki et al. | WO | WO 01/29893 A1 | 4/2001 |
| 2005/0070126 | A1 | 3/2005 | Senzaki | WO | WO 01/36702 A1 | 5/2001 |
| 2005/0095859 | A1 | 5/2005 | Chen et al. | WO | WO 01/40541 A1 | 6/2001 |
| 2005/0104142 | A1 | 5/2005 | Narayanan et al. | WO | WO 01/66832 A1 | 9/2001 |
| 2005/0124109 | A1 | 6/2005 | Quevedo-Lopez et al. | WO | WO 01/82390 A1 | 11/2001 |
| 2005/0130442 | A1 | 6/2005 | Visokay et al. | WO | WO 01/99166 | 12/2001 |
| 2005/0153571 | A1 | 7/2005 | Senzaki | WO | WO 02/01628 A2 | 1/2002 |
| 2005/0233156 | A1 | 10/2005 | Senzaki et al. | WO | WO 02/08485 A2 | 1/2002 |
| 2005/0255243 | A1 | 11/2005 | Senzaki | WO | WO 02/08488 | 1/2002 |
| 2006/0121744 | A1* | 6/2006 | Quevedo-Lopez et al. ... 438/785 | WO | WO 02/09167 A2 | 1/2002 |
| 2006/0273408 | A1* | 12/2006 | Kamiyama et al. ........ 257/401 | WO | WO 02/27063 A2 | 4/2002 |
| FOREIGN PATENT DOCUMENTS | | | | WO | WO 02/31875 A2 | 4/2002 |
| EP | 0 497 267 | | 8/1992 | WO | WO 02/43115 A2 | 5/2002 |
| EP | 0 973 189 | | 1/2000 | WO | WO 02/45167 A2 | 6/2002 |
| EP | 0 973 191 | | 1/2000 | WO | WO 02/45871 A1 | 6/2002 |
| EP | 1 146 141 | | 10/2001 | WO | WO 02/065525 A1 | 8/2002 |
| EP | 1146141 | A2 | 10/2001 | | | |

| WO | WO 02/067319 A2 | 8/2002 |
| WO | WO 03/023835 | 3/2003 |
| WO | WO 2005/117086 | 12/2005 |

OTHER PUBLICATIONS

Applied. Phys. Lett. 71 (25), Dec. 22, 1997 (3604-6).
Argarwal, et al., "Challenges in Integrating the High-K Gate Dielectric Film to the Conventional CMOS Process Flow," Mat. Sec. Soc. Sump. Proc. vol. 670 (2001).
Balog, et al., "Chemical Vapor Deposition and Characterization of $HfO_2$ Films from Organo-Hafnium Compounds," Thin Solid Films, 41 (1977) 247-259.
Bedair, "Atomic Layer Epitaxy Deposition Processes," J. Vac. Sci. Technol. B., vol. 12, No. 1, Jan./Feb. 1994.
Chang-Wook, et al., "Growth and Characterization of Aluminum Oxide ($Al_2O_3$) Thin Films by Plasma-Assisted Atomic Layer Controlled Deposition," J. Korean Inst. Met. Mater., vol. 38, No. 10, Oct. 2000 pp. 1395-1399.
Chang-Wook, et al., "Plasma-assisted Atomic Layer Growth of High-Quality Aluminum Oxide Thin Films," Jpn. J. Appl. Phys. 1, vol. 40, No. 1, Jan. 2001 pp. 285-289.
Chatham, Hood; et al., "Nitridation of Hafnium Silicate Thin Films", Mat. Res. Soc. Symp. Proc. vol. 811, Apr. 12-16, 2004, D7.5.1.
Cheon, et al., "Gas Phase Photoproduction of Diatomic Metal Nitrides During Metal Nitride Laser Chemical Vapor Deposition," Inorg. Chem. 1999, 38, 2238-2239.
Choi, et al., "Stability of $TiB_2$ as a Diffusion Barrier on Silicon," J. Electrochem. Soc., vol. 138, No. 10, Oct. 1991.
Choi, et al., "The Effect of Annealing on Resistivity of Low Pressure Chemical Vapor Deposited Titanium Diboride," J. Appl. Phys. 69(11), Jun. 1, 1991.
Clark-Phelps, et al., "Engineered Tantalum Aluminate and Hafnium Aluminate ALD Films for Ultrathin Dielectric Films with Improved Electrical and Thermal Properties," Mat. Res. Soc. Symp. Proc. vol. 670 (2001).
Conley, J.F.; et al, "Interval Annealing During Alternating Pulse Deposition", Mat. Res. Soc. Symp. Proc. vol. 811, Apr. 12-16, 2004, D1.3.1.
Derbyshire, "Applications of Integrated Processing," Solid State Technology, Dec. 1994.
Eisenbraum, et al., "Atomic Layer Deposition (ALD) of Tantalum-based materials for zero thickness copper barrier applications," Proceedings of the IEEE 2001 International Interconnect Technology Conference (Cat. No. 01EX461) 2001.
Elers, et al., "$NbCl_5$ as a Precursor in Atomic Layer Epitaxy," Applied Surface Science 82/83 (1994) 468-474.
George, et al., "Atomic Layer Controlled Deposition of $SiO_2$ and $Al_2O_5$ using ABAB . . . binary reaction sequence chemistry," Applied Surface Science 82/83 (1994) 460-467.
George, et al., "Surface Chemistry for Atomic Layer Growth," J. Phys. Chem. 1996, 100, 13121-13131.
Hendrix, et al., "Composition Control of $Hf_{1-x}Si_xO_2$ Films Deposited on Si by Chemical-vapor Deposition Using Amide Precursors," Applied Physics Letters, vol. 80, No. 13 (Apr. 1, 2002).
Hwang, et al., "Nanometer-Size $\alpha$-$PbO_2$-type $TiO_2$ in Garnet: A Thermobarometer for Ultrahigh-Pressure Metamorphism," Science Vo. 288 (Apr. 14, 2000).
Kattelus, et al., "Electrical Properties of Tantalum Based Composite Oxide Films," Mat. Res. Soc. Symp. Proc., 284 (1993) 511-516.
Klaus, et al., "Atomic Layer Deposition of $SiO_2$ Using Catalyzed and Uncatalyzed Self-Limiting Surface Reactions," Surface Review and Letters, vol. 6, Nos. 3 & 4 (1999) 435-448.
Kukli, et al., "Atomic Layer Epitaxy Growth of Tantalum Oxide Thin Films from $Ta(OC_2H_5)_5$ and $H_2O$," Journal of the Electrochemical Society, vol. 142, No. 5, May 1995; p. 1670-5.
Kukli, et al., "In situ Study of Atomic Layer Epitaxy Growth of Tantalum Oxide Thin Films From $Ta(OC_2H_5)_5$ and $H_2O$," Applied Surface Science, vol. 112, Mar. 1997, p. 236-42.
Kukli, et al., "Properties of $(Nb_{1-x}Ta_x)_2O_5$ Solid Solutions and $(Nb_{1-x}Ta_x)_2O_5$-$ZrO_2$ Nanolaminates Grown by Atomic Layer Epitaxy," 1997; p. 785-93.
Kukli, et al., "Properties of $Ta_2O_5$-Based Dielectric Nanolaminates Deposited by Atomic Layer Epitaxy," Journal of the Electrochemical Society, vol. 144, No. 1, Jan. 1997; p. 300-6.
Kukli, et al., "Tailoring the Dielectric Properties of $HfO_2$-$Ta_2$-$O_5$ Nanolaminates," Applied Physics Letters, vol. 68, No. 26, Jun. 24, 1996; p. 3737-9.
Lee, et al., "Cyclic Technique for the Enhancement of Highly Oriented Diamond Film Growth," Thin Solid Films 303 (1997) 264-269.
Martensson, et al., "Use of Atomic Layer Epitaxy for Fabrication of Si/TiN/Cu Structures," J. Vac. Sci. & Tech. B, vol. 17, No. 5, (Sep. 1999) pp. 2122-2128.
Min, et al., "Atomic Layer Deposition of TiN Thin Films by Sequential Introduction of Ti Precursor and NH3," Mat. Res. Soc. Symp. Proc. vol. 514 (1998).
Min, et al., "Chemical Vapor Deposition of Ti-Si-N. Films With Alternating Source Supply," Mat. Rec. Soc. Symp. Proc. vol. (1999).
Min, et al., "Metal-organic Atomic-layer Deposition of Titanium-silicon-nitride films," Applied Physics Letters, vol. 75, No. 11 (Sep. 13, 1999).
Niinisto, et al., "Synthesis of Oxide Thin Films and Overtayers by Atomic Layer Epitaxy for Advanced Applications," Materials Science and Engineering B41 (1996) 23-29.
Ohshita, et al., "$HfO_2$ Growth by Low-pressure Chemical Vapor Deposition Using the $Hf(N(C_2H_5)_2)_4$/$O_2$ Gas System," Journal of Crystal Growth 233 (2001) 292-297.
Paranjpe, et al., "Atomic Layer Deposition of $AlO_3$ for Thin Film Head Gap Applications," J. Elec. Soc., vol. 148, No. 9 Sep. 2001 pp. G465-471.
Proceedings of the ICEEE 1998 International Interconnect Technology Conference—San Francisco, California, Jun. 1-3, 1998.
Ritala, et al., Ann. Acad. Sci. Fenn. Ser. A II. Chemica 257 (1994) 1-48.
Ritala, et al., "Atomic Force Microscopy Study of Titanium Dioxide Thin Films Grown by Atomic Layer Epitaxy," Thin Solid Films, vol. 228, No. 1.2 (May 15, 1993), pp. 32-35.
Ritala, et al., "Atomic Layer Deposition of Oxide Thin Films with Metal Alkoxides as Oxygen Sources," Science vol. 288 Apr. 14, 2000.
Ritala, et al., "Atomic Layer Epitaxy Growth of TiN Thin Films From $TiI_4$ and $NH_3$," J. Electrochem. Soc., vol. 145, No. 8 (Aug. 1998) pp. 2914-2920.
Ritala, et al., "Atomic Layer Epitaxy Growth of TiN Thin Films," J. Electrochem. Soc., vol. 142, No. 8, Aug. 1995.
Ritala, et al., "Development of Crystallinity and Morphology in Hafnium Dioxide Thin Films Grown by Atomic Layer Epitaxy," Thin Solid Films, vol. 250, No. 1-2, (Oct. 1, 1994), p. 72-80.
Ritala, et al., "Effects of Intermediate Zinc Pulses on Properties of TiN and NbN Films by Atomic Layer Epitaxy," Applied Surface Science, vol. 120, No. 3-4, (Dec. 1997), pp. 199-212.
Ritala, et al., "Growth of Titanium Dioxide Thin Films by Atomic Layer Epitaxy," Thin Solid Films, vol. 225, No. 1.2 (Mar. 25, 1993) pp. 288-295.
Ritala, et al., "Perfectly Conformal TiN and $Al_2O_3$ Films Deposited by Atomic Layer Deposition," Chem. Vap. Deposition 1999, 5, No. 1.
Ritala, et al., "Surface Roughness Reduction in Atomic Layer Epitaxy Growth of Titanium Dioxide Thin Films," Thin Solid-Films, vol. 249, No. 2 (Sep. 15, 1994), pp. 155-162.
Rossnagel, et al., "Plasma-enhanced Atomic Layer Deposition of Ta and Ti for Interconnect Diffusion Barriers," J. Vacuum Sci. & Tech. B., vol. 18, No. 4 (Jul. 2000), pp. 2016-2020.
Senzaki, Yoshihide, et al., "A Novel Atomic Layer Deposition Process to Deposit Hafnium Silicate Thin Films", Electrochemical Society Proceedings vol. 2004-01, pp. 264-270.
Ho, et al., "Suppressed crystallization of Hf-based gate dielectrics by controlled addition of $Al_2O_3$ using atomic layer deposition", Applied Physics Letters, American Institute of Physics, New York, US, vol. 81, No. 22, Nov. 25, 2002, pp. 4218-4220.
Kawahara, at al., "Effects of Hf sources, oxidizing agents, and $NH_3$ radicals on properties of $HfAlO_x$ films prepared by atomic layer deposition", IWGI 2003, Tokyo, Nov. 6, 2003, pp. 32-37.
Kukli, et al., "Atomic Layer Deposition of Hafnium Dioxide Films from Hafnium Tetrakis(ethylmethylamide) and Water", Chemical Vapor Deposition, VCH Publishers, Weinheim, DE, vol. 8, No. 5, Sep. 2002, pp. 199-204.

Ohshita, et al., "$Hf_{1-x}Si_{xO2}$ deposition by metal organic chemical vapor deposition using the $Hf)NEt_2)_4/SiH(NEt_2)_3/O_2$ gas system", Preparation and Characterization, Elsevier Sequoia, NL vol. 416, No. 1-2, Sep. 2, 2002, pp. 208-211.

Visokay, et al., "Application of HfSiON as a gate dielectric material", Applied Physics Letter, American Institute of Physics, New York, US, vol. 80, No. 17, Apr. 29, 2002, pp. 3183-3185.

Goto, et al. "Atomic layer controlled deposition of silicon nitride with self-limiting mechanism," Applied Physics Letters, American Institute of Physics. New York, US, vol. 68, No. 23, Jun. 3, 1996, pp. 3257-3259.

Kamiyama, et al. "Improvement in the uniformity and the thermal stability of Hf-silicate gate dielectric by plasma-nitridation," Gate Insulator, 2003. IWGI 2003. Extended Abstracts of International Workshop on Nov. 6-7, 2003, Piscataway, NJ, USA, IEEE, Nov. 6, 2002, pp. 42-46.

International Search Report for International Application No. PCT/US2005/016606 dated Aug. 22, 2005.

Written Opinion of Search Report for International Application No. PCT/US2005/016606 dated Aug. 22, 2005.

International Search Report for International Application No. PCT/US2005/016603 dated Sep. 15, 2005.

Written Opinion of the International Search Report for International Application No. PCT/US2005/016603 dated Sep. 15, 2005.

International Search Report for International Application No. PCT/US2005/016690 dated Aug. 22, 2005.

Written Opinion of the International Search Report for International Application No. PCT/US2005/016690 dated Aug. 22, 2005.

PCT International Search Report and the Written Opinion for International Application No. PCT/US2006/022997 dated Nov. 11, 2006.

PCT International Search Report and the Written Opinion for International Application No. PCT/US2006/022997 dated Nov. 9, 2006.

European Examination Report dated Feb. 27, 2007 for European Application No. 05747422.3-1235.

European Examination Report dated Apr. 12, 2007 for European Application No. 05747422.3-1235.

Chinese Office Action, Application No. 200680033018.5, dated Apr. 3, 2009.

PCT International Search Report and the Written Opinion for International Application No. PCT/US2006/24953 dated Mar. 2, 2007.

Wikipedia—definition of Pressure.

Kim, et al., Substrate dependence on the optical properties of $Al_2O_3$ films grown by atomic layer deposition, Applied Physics Letters 71 (25), Dec. 22, 1997, pp. 3604-3606.

U.S. Office Action mailed Aug. 20, 2008, for U.S. Appl. No. 11/167,070.

U.S. Final Office Action mailed Mar. 23, 2009, for U.S. Appl. No. 11/167,070.

U.S. Office Action mailed Aug. 19, 2008, for U.S. Appl. No. 11/223,896.

U.S. Final Office Action mailed Jan. 12, 2009, for U.S. Appl. No. 11/223,896.

U.S. Advisory Action mailed Mar. 17, 2009, for U.S. Appl. No. 11/223,896.

U.S. Office Action mailed Dec. 12, 2008, for U.S. Appl. No. 11/298,553.

U.S. Final Office Action mailed Apr. 28, 2009, for U.S. Appl. No. 11/298,553.

* cited by examiner

STABILIZATION OF HIGH-K DIELECTRIC MATERIALS

BACKGROUND OF THE INVENTION

Field of the Invention

Embodiments of the present invention generally relate to methods for depositing materials on substrates, and more specifically, to methods for depositing and stabilizing dielectric materials.

In the field of semiconductor processing, flat-panel display processing or other electronic device processing, chemical vapor deposition has played an important role in forming films on substrates. As the geometries of electronic devices continue to shrink and the density of devices continues to increase, the size and aspect ratio of the features are becoming more aggressive, e.g., feature sizes of 0.07 microns and aspect ratios of 10 or greater are being considered. Accordingly, conformal deposition of materials to form these devices is becoming increasingly important.

While conventional chemical vapor deposition has proved successful for device geometries and aspect ratios down to 0.15 microns, the more aggressive device geometries require new, innovative deposition techniques. One technique that is receiving considerable attention is atomic layer deposition (ALD). In the scheme, reactants are sequentially introduced into a processing chamber where each reactant chemisorbs onto the substrate surface and a reaction occurs. A purge step is typically carried out between the delivery of each reactant gas. The purge step may be a continuous purge with the carrier gas or a pulse purge between the delivery of the reactant gases.

ALD processes have been successfully implemented to deposit films, such as dielectric layers, barrier layers and conductive layers. High-k dielectric materials deposited by ALD processes have been used extensively for gate applications and capacitor application. Some of the common high-k materials produced by ALD processes include hafnium oxide, hafnium silicate, zirconium oxide and tantalum oxide, among others.

Dielectric materials, such as high-k dielectric materials, may experience morphological changes when exposed to high temperatures (>500° C.) during subsequent fabrication processes. For example, titanium nitride is often deposited on hafnium oxide or zirconium oxide by a chemical vapor deposition (CVD) technique at about 600° C. However, the amorphous films of hafnium oxide or zirconium oxide may crystallize and lose their low leakage properties. Also, even if full crystallization of the high-k material is not encountered, exposure to high temperatures may form grain growth and/or phase separation resulting in poor device performance due to high current leakage.

Therefore, there is a need for a process to form dielectric materials, especially high-k dielectric materials, which are morphologically stable during exposure to high temperatures during subsequent fabrication processes.

SUMMARY OF THE INVENTION

In one embodiment, a method for forming a dielectric stack on a substrate is provided which includes depositing a first layer of a dielectric material on a substrate surface, exposing the first layer to a nitridation process, depositing a second layer of the dielectric material on the first layer, exposing the second layer to the nitridation process, and exposing the substrate to an anneal process.

In another embodiment, a method for forming a dielectric stack on a substrate is provided which includes a) depositing a dielectric material layer with a thickness in a range from about 5 Å to about 20 Å on a substrate surface, b) exposing the dielectric material layer to a nitridation process, c) optionally exposing the substrate to an anneal process, and d) repeating a process cycle of at least steps a-b to form the dielectric stack with a predetermined thickness.

In another embodiment, a method for forming a dielectric stack on a substrate is provided which includes a) depositing a dielectric material layer on the substrate, b) exposing the dielectric material layer to a nitridation process, c) exposing the substrate to an anneal process, and d) repeating a process cycle of steps a-c to form the dielectric stack with a predetermined thickness.

In another embodiment, a method for forming a dielectric stack on a substrate is provided which includes a) depositing a dielectric material layer on the substrate, b) exposing the dielectric material layer to a nitridation process, and c) repeating a process cycle of steps a-b to form the dielectric stack with a predetermined thickness.

In another embodiment, a method for forming a dielectric nitride material on a substrate is provided which includes depositing a dielectric layer on a substrate surface, exposing the dielectric layer to a nitridation process, and exposing the dielectric layer to an anneal process.

In another embodiment, a method for forming a dielectric material on a substrate is provided which includes depositing a metal oxide layer substantially free of silicon on a substrate surface, exposing the metal oxide layer to a nitridation process, and exposing the substrate to an anneal process.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of the invention and are therefore not to be considered limiting of its scope, for the invention may admit to other equally effective embodiments.

DETAILED DESCRIPTION OF THE PREFERRED EMBODIMENT

Figure 1:
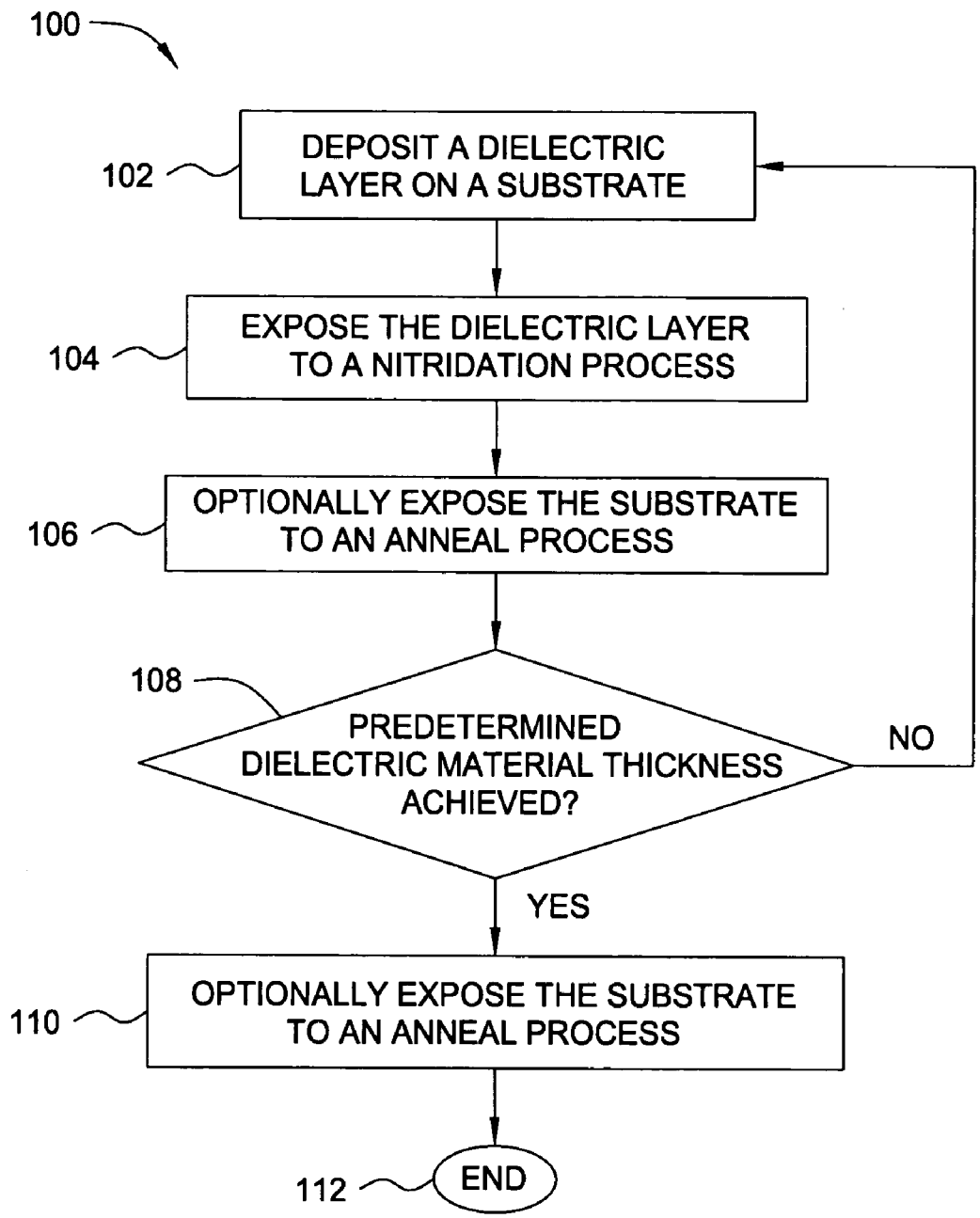
FIG. 1 illustrates a process sequence for forming a dielectric material according to one embodiment described herein.

The present invention provides methods for preparing dielectric materials used in a variety of applications, especially for high-k dielectric materials used in transistor and/or capacitor fabrication. Some of the methods use atomic layer deposition (ALD) to have elemental control of the composition of the dielectric compounds. In one embodiment, a dielectric material is formed by conducting multiple cycles of a deposition process that include depositing a dielectric layer, exposing the dielectric layer to a nitridation process and optionally exposing the dielectric layer to an anneal process. The deposition process is repeated until the dielectric material has a desired thickness. In another embodiment, a dielectric material is formed by depositing a dielectric film and subsequently exposing the dielectric film to a nitridation process and an anneal process. The dielectric film is usually a metal oxide and substantially silicon-free.

A "substrate surface" as used herein refers to any substrate or material surface formed on a substrate upon which film processing is performed. For example, a substrate surface on which processing may be performed include materials such as dielectric materials, silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Barrier layers, metals or metal nitrides on a substrate surface include titanium, titanium nitride, tungsten nitride, tantalum and tantalum nitride. Substrates may have various dimensions, such as 200 mm or 300 mm diameter wafers, as well as, rectangular or square panes. Embodiments of the processes described herein deposit silicon-containing compounds on many substrates and surfaces, especially, high-k dielectric materials. Substrates on which embodiments of the invention may be useful include, but are not limited to semiconductor wafers, such as crystalline silicon (e.g., Si<100> or Si<111>), silicon oxide, strained silicon, SOI, silicon germanium, doped or undoped polysilicon, doped or undoped silicon wafers silicon nitride and patterned or non-patterned wafers. Surfaces include bare silicon wafers, films, layers and materials with dielectric, conductive and barrier properties and include aluminum oxide and polysilicon. Pretreatment of surfaces includes polishing, etching, reduction, oxidation, hydroxylation, annealing and/or baking.

"Atomic layer deposition" or "cyclical deposition" as used herein refers to the sequential introduction of two or more reactive compounds to deposit a layer of material on a substrate surface. The two, three or more reactive compounds may alternatively be introduced into a reaction zone of a processing chamber. Usually, each reactive compound is separated by a time delay to allow each compound to adhere and/or react on the substrate surface. In one aspect, a first precursor or compound A is pulsed into the reaction zone followed by a first time delay. Next, a second precursor or compound B is pulsed into the reaction zone followed by a second delay. During each time delay a purge gas, such as nitrogen, is introduced into the processing chamber to purge the reaction zone or otherwise remove any residual reactive compound or by-products from the reaction zone. Alternatively, the purge gas may flow continuously throughout the deposition process so that only the purge gas flows during the time delay between pulses of reactive compounds. The reactive compounds are alternatively pulsed until a desired film or film thickness is formed on the substrate surface. In either scenario, the ALD process of pulsing compound A, purge gas, pulsing compound B and purge gas is a cycle. A cycle can start with either compound A or compound B and continue the respective order of the cycle until achieving a film with the desired thickness.

A "pulse" as used herein is intended to refer to a quantity of a particular compound that is intermittently or non-continuously introduced into a reaction zone of a processing chamber. The quantity of a particular compound within each pulse may vary over time, depending on the duration of the pulse. The duration of each pulse is variable depending upon a number of factors such as, for example, the volume capacity of the process chamber employed, the vacuum system coupled thereto, and the volatility/reactivity of the particular compound itself. A "half-reaction" as used herein is intended to refer to a pulse of precursor step followed by a purge step.

Nitrogen Stabilization of Multi-Layered Dielectric Material

In FIG. 1, illustrates an exemplary process 100 for forming a dielectric material, such as a hafnium silicon oxynitride material. FIGS. 2A-3K correspond to process 100 to illustrate the formation of a dielectric material used in a semiconductor device, such as a transistor and/or capacitor. Multiple dielectric layers of the same or similar composition are deposited sequentially to form a dielectric material. Each dielectric layer is deposited with morphology of either an amorphous layer or a layer containing nanocrystalline material. The morphology depends on the thickness of each individual layer since the layer thickness essentially results in dimensional confinement of the material. If the confinement is small, that is, if the layer thickness is thin enough, then the layer may be forced to remain amorphous.

Figure 2A:
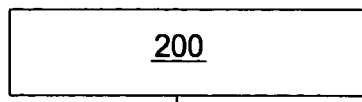
FIGS. 2A-2I illustrate a process sequence for depositing multiple layers on a substrate surface according to another embodiment described herein.
Figure 2B:
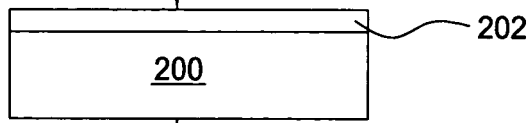

In one embodiment of process 100, a dielectric layer 202 is deposited on a substrate 200, in step 102, by conventional deposition techniques, such as ALD, chemical vapor deposition (CVD), physical vapor deposition (PVD), thermal techniques and combinations thereof, as depicted in FIGS. 2A-2B. In a preferred embodiment, dielectric layer 202 is deposited by an ALD process and apparatus, such as described in co-pending United States Provisional Patent Application Serial No. unknown, filed May 12, 2004, entitled, "Atomic Layer Deposition of Hafnium-containing High-K Materials," assigned to Applied Materials, Inc., and is herein incorporated by reference. Dielectric layer 202 is generally deposited with a film thickness from about 1 Å to about 50 Å, preferably from about 5 Å to about 30 Å and more preferably from about 5 Å to about 20 Å, for example, about 15 Å.

A substrate may be pretreated before depositing dielectric layer 202 in order to have termination with a variety of functional groups such as hydroxyls (OH), alkoxy (OR, where R=Me, Et, Pr or Bu), haloxyls (OX, where X=F, Cl, Br or I), halides (F, Cl, Br or I), oxygen radicals, aminos (NH or $NH_2$) and amidos (NR or $NR_2$, where R=H, Me, Et, Pr or Bu). A pretreatment is especially useful prior to depositing dielectric layer 202 with an ALD process or a CVD process. A pretreatment may be effected by administering a reagent, such as $NH_3$, $B_2H_6$, $SiH_4$, $Si_2H_6$, $H_2O$, HF, HCl, $O_2$, $O_3$, $H_2O$, $H_2O/O_2$, $H_2O/H_2$, $H_2O_2$, $H_2$, atomic-H, atomic-N, atomic-O, alcohols or amines. Once the surface of the substrate is pretreated, an ALD cycle is started. For many of the high-k dielectric materials, the precursor adsorption is self-limiting under certain process conditions, and generally is at low temperatures (<300° C.) to exhibit this behavior. In one embodiment, the pretreatment may involve a presoak with a reagent prior to depositing a hafnium compound. The presoak may involve exposing the substrate surface to the reagent for a period of time from about 5 seconds to about 120 seconds, preferably from about 5 seconds to about 30 seconds. In one example, the substrate surface is exposed to water vapor for about 15 seconds prior to starting an ALD process to deposit dielectric layer 202.

Dielectric layer 202 is generally a high-k dielectric material and includes combinations of hafnium, zirconium, titanium, tantalum, lanthanum, aluminum, silicon, oxygen and/or nitrogen. Dielectric layer 202 may have a composition that includes hafnium-containing materials, such as hafnium oxides (HfO$_x$ or HfO$_2$), hafnium silicates (HfSi$_x$O$_y$ or HfSiO$_4$), hafnium silicon oxynitrides (HfSi$_x$O$_y$N$_z$), hafnium oxynitrides (HfO$_x$N$_y$), hafnium aluminates (HfAl$_x$O$_y$), hafnium aluminum silicates (HfAl$_x$Si$_y$O$_z$), hafnium aluminum silicon oxynitrides (HfAl$_w$Si$_x$O$_y$N$_z$), hafnium lanthanum oxides (HfLa$_x$O$_y$), zirconium-containing materials, such as zirconium oxides (ZrO$_x$ or ZrO$_2$), zirconium silicates (ZrSi$_x$O$_y$ or ZrSiO$_4$), zirconium silicon oxynitrides (ZrSi$_x$O$_y$N$_z$), zirconium oxynitrides (ZrO$_x$N$_y$), zirconium aluminates (ZrAl$_x$O$_y$), zirconium aluminum silicates (ZrAl$_x$Si$_y$O$_z$), zirconium aluminum silicon oxynitrides (ZrAl$_w$Si$_x$O$_y$N$_z$), zirconium lanthanum oxides (ZrLa$_x$O$_y$), other aluminum-containing materials or lanthanum-containing materials, such as aluminum oxides (Al$_2$O$_3$ or AlO$_x$), aluminum oxynitrides (AlO$_x$N$_y$), aluminum silicates (AlSi$_x$O$_y$), aluminum silicon oxynitrides (AlSi$_x$O$_y$N$_z$), lanthanum aluminum oxides (LaAl$_x$O$_y$), lanthanum oxides (LaO$_x$ or La$_2$O$_3$), derivatives thereof and combinations thereof. Other dielectric materials useful for dielectric layer 202 may include titanium oxides (TiO$_x$ or TiO$_2$), titanium oxynitrides (TiO$_x$N$_y$), tantalum oxides (TaO$_x$ or Ta$_2$O$_5$) and tantalum oxynitrides (TaO$_x$N$_y$).

Figure 2C:
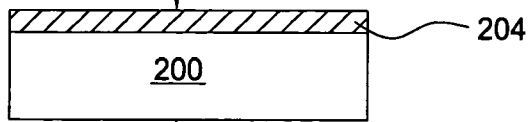

In step 104, the dielectric layer 202 is exposed to a nitridation process that physically incorporates nitrogen atoms into the dielectric material to form nitrogen-containing dielectric layer 204, as depicted in FIG. 2C. The nitridation process may include decoupled plasma nitridation (DPN), remote plasma nitridation, hot-wired induced atomic-N, and nitrogen incorporation during the dielectric layer deposition (e.g., during ALD or CVD processes). The nitrogen-containing dielectric layer 204 is usually nitrogen-rich at the surface. The nitrogen concentration of nitrogen-containing dielectric layer 204 may be in the range from about 5 atomic percent (at %) to about 40 at %, preferably from about 10 at % to about 25 at %. Preferably, the nitridation process exposes the dielectric layer 202 to nitrogen plasma, such as a DPN process.

In one embodiment, the substrate is transferred to a DPN chamber, such as the CENTURA™ DPN chamber, available from Applied Materials, Inc., located in Santa Clara, Calif. In one aspect, the DPN chamber is on the same cluster tool as the ALD chamber used to deposit the dielectric layer 202. Therefore, the substrate may be exposed to a nitridation process without being exposed to the ambient environment. During a DPN process, the dielectric layer 202 is bombarded with atomic-N formed by co-flowing N$_2$ and a noble gas plasma, such as argon. Besides N$_2$, other nitrogen-containing gases may be used to form the nitrogen plasma, such as NH$_3$, hydrazines (e.g., N$_2$H$_4$ or MeN$_2$H$_3$), amines (e.g., Me$_3$N, Me$_2$NH or MeNH$_2$), anilines (e.g., C$_6$H$_5$NH$_2$), and azides (e.g., MeN$_3$ or Me$_3$SiN$_3$). Other noble gases that may be used in a plasma process include helium, neon and xenon. The nitridation process proceeds at a time period from about 10 seconds to about 120 seconds, preferably from about 15 seconds to about 60 seconds, for example, about 30 seconds. Also, the nitridation process is conducted at a plasma power setting from about 900 watts to about 2,700 watts and a pressure at about 10 mTorr to about 100 mTorr. The nitrogen has a flow from about 0.1 slm to about 1.0 slm, while the noble gas has a flow from about 0.1 slm to about 1.0 slm. In a preferred embodiment, the nitridation process is a DPN process and includes a plasma by co-flowing Ar and N$_2$.

In another embodiment, instead of transferring the substrate to the DPN chamber, a nitridation process may include exposing the dielectric layer 202 to nitrogen plasma in the same deposition chamber that dielectric layer 202 is deposited. For example, a nitridizing remote-plasma is exposed to dielectric layer 202 to form nitrogen-containing dielectric layer 204 directly in process chamber configured with a remote-plasma device, such as an ALD chamber or a CVD chamber. Radical nitrogen compounds may also be produced by heat or hot-wires and used during nitridation processes. Other nitridation processes to form nitrogen-containing dielectric layer 204 are contemplated, such as annealing the substrate in a nitrogen-containing environment, and/or including a nitrogen precursor into an additional half reaction within the ALD cycle while forming the nitrogen-containing dielectric layer 204. For example, an additional half reaction during an ALD cycle to form hafnium silicate may include a pulse of NH$_3$ followed by a pulse of purge gas.

In one embodiment depicted in FIGS. 2A-2I, the optional anneal process is omitted during step 106. In step 108, the predetermined thickness of dielectric material is decided. If, after one cycle of steps 102-106, the predetermined thickness of dielectric material is achieved, then process 100 may endure an optional anneal process at step 110 and process 100 is ended at step 112. However, in the preferred embodiment, the dielectric material thickness is not achieved after only one cycle of steps 102-106 and therefore is repeated by starting over at step 102.

Figure 2D:
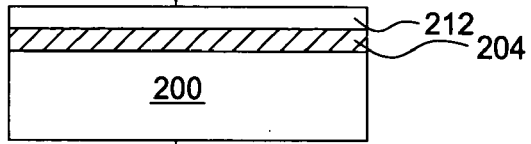
Figure 2E:
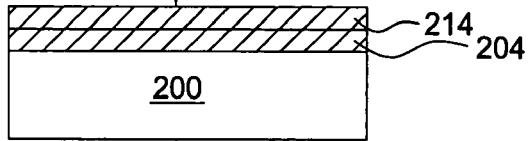
Figure 2F:
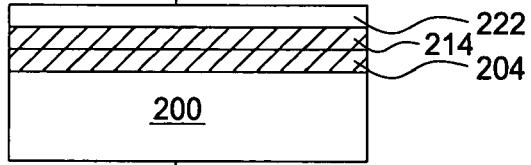
Figure 2G:
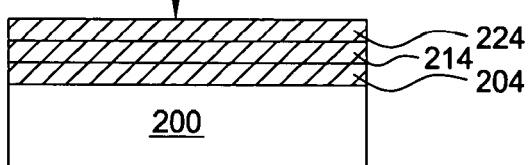

In FIG. 2D, dielectric layer 212 is deposited on nitrogen-containing dielectric layer 204 by the same process as discussed in step 102. The layer thickness of dielectric layer 212 does not have to be the same thickness as dielectric layer 202, but generally have similar thicknesses. In FIG. 2E, dielectric layer 212 is exposed to a nitridation process as discussed in step 104 to form nitrogen-containing dielectric layer 214. In FIG. 2F, dielectric layer 222 is deposited on nitrogen-containing dielectric layer 214 by the same process as discussed in step 102. In FIG. 2E, dielectric layer 222 is exposed to a nitridation process as discussed in step 104 to form nitrogen-containing dielectric layer 224. Steps 102-106 may be repeated to form the predetermined thickness of the dielectric material.

Figure 2H:
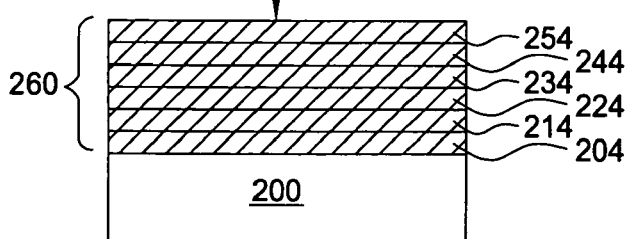

FIG. 2H depicts a stack 260 of nitrogen-containing dielectric layers 204, 214, 224, 234, 244 and 254 after steps 102-106 have been performed six times. Thereafter, if the predetermined thickness of dielectric material is achieved during step 108, the substrate is exposed to the optional anneal process during step 110. The substrate is transferred to an anneal chamber, such as the CENTURA™ RADIANCE™ RTP chamber available from Applied Materials, Inc., located in Santa Clara, Calif., and exposed to an anneal process. The anneal chamber may be on the same cluster tool as the deposition chamber and/or the nitridation chamber. Therefore, the substrate may be annealed without being exposed to the ambient environment. The substrate is maintained at a temperature from about 600° C. to about 1,200° C. for a time period from about 1 second to about 120 seconds, for example, at about 1,000° C. for about 15 seconds. Generally, the process chamber atmosphere contains at least one anneal gas, such as O$_2$, N$_2$, NH$_3$, N$_2$H$_4$, NO, N$_2$O, or combinations thereof. The chamber is maintained at a pressure from about 1 Torr to about 100 Torr, for example, at about 5 Torr.

Figure 2I:
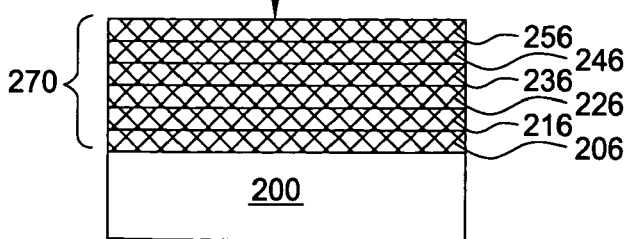

The anneal process converts stack 260 to the dielectric material or stack 270, which contains dielectric nitride material layers 206, 216, 226, 236, 246 and 256, as depicted in FIG. 2I. The anneal process repairs any damage caused by plasma bombardment during step 104 and reduces the fixed charge of the dielectric nitride layers. Each of the dielectric nitride material layers 206, 216, 226, 236, 246 and 256 may have a film thickness from about 1 Å to about 50 Å, preferably from about 5 Å to about 30 Å and more preferably from about 5 Å to about 20 Å, for example, about 15 Å. Dielectric material or stack 270 generally has a thickness from about 10 Å to about 250 Å, preferably from about 20 Å to about 100 Å, for example, 60 Å. In one embodiment, dielectric material or stack 270 has a thickness of 60 Å or less.

Figure 3A:
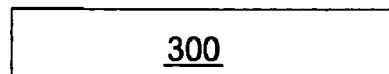
FIGS. 3A-3K illustrate another process sequence for depositing multiple layers on a substrate surface according to another embodiment described herein.
Figure 3B:
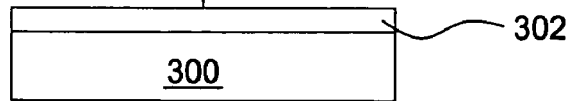

In another embodiment of process 100, a dielectric layer 302 is deposited on a substrate 300, in step 102, by conventional deposition techniques, such as ALD, chemical vapor deposition (CVD), physical vapor deposition (PVD), thermal techniques and combinations thereof, as depicted in FIGS. 3A-3B. In a preferred embodiment, dielectric layer 302 is deposited by an ALD process, as discussed above for dielectric layer 202. Dielectric layer 302 is generally a high-k dielectric material and includes combinations of hafnium, zirconium, titanium, tantalum, lanthanum, aluminum, silicon, oxygen and/or nitrogen. Dielectric layer 302 may have the composition as dielectric layer 202, as discussed above. Dielectric layer 302 is generally deposited with a film thickness from about 1 Å to about 50 Å, preferably from about 5 Å to about 30 Å and more preferably from about 5 Å to about 20 Å, for example, about 15 Å.

Figure 3C:
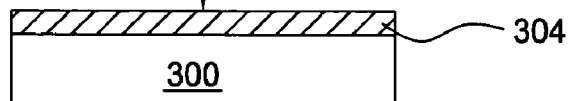

In step 104, the dielectric layer 302 is exposed to a nitridation process that physically incorporates nitrogen atoms into dielectric film to form nitrogen-containing dielectric layer 304, as depicted in FIG. 3C. The nitridation process may include decoupled plasma nitridation (DPN), remote plasma nitridation, hot-wired induced atomic-N, and nitrogen incorporation during dielectric deposition (e.g., during ALD or CVD processes). The nitrogen-containing dielectric layer 304 is usually nitrogen-rich at the surface. The nitrogen concentration of nitrogen-containing dielectric layer 304 may be in the range from about 5 at % to about 40 at %, preferably from about 10 at % to about 25 at %. Preferably, the nitridation process exposes the dielectric layer 302 to nitrogen plasma, such as a DPN process.

In one embodiment, the substrate is transferred to a DPN chamber, such as the CENTURA™ DPN chamber, available from Applied Materials, Inc., located in Santa Clara, Calif. In one aspect, the DPN chamber is on the same cluster tool as the ALD chamber used to deposit the dielectric layer 302. Therefore, the substrate may be exposed to a nitridation process without being exposed to the ambient environment. During a DPN process, the dielectric layer 302 is bombarded with atomic-N formed by co-flowing $N_2$ and a noble gas plasma, such as argon. Besides $N_2$, other nitrogen-containing gases may be used to form the nitrogen plasma, such as $NH_3$, hydrazines (e.g., $N_2H_4$ or $MeN_2H_3$), amines (e.g., $Me_3N$, $Me_2NH$ or $MeNH_2$), anilines (e.g., $C_6H_5NH_2$), and azides (e.g., $MeN_3$ or $Me_3SiN_3$). Other noble gases that may be used in a plasma process include helium, neon and xenon. The nitridation process proceeds at a time period from about 10 seconds to about 120 seconds, preferably from about 15 seconds to about 60 seconds, for example, about 30 seconds. Also, the nitridation process is conducted at a plasma power setting from about 900 watts to about 2,700 watts and a pressure at about 10 mTorr to about 100 mTorr. The nitrogen has a flow from about 0.1 slm to about 1.0 slm, while the noble gas has a flow from about 0.1 slm to about 1.0 slm. In a preferred embodiment, the nitridation process is a DPN process and includes a plasma by co-flowing Ar and $N_2$.

In another embodiment, instead of transferring the substrate to the DPN chamber, a nitridation process may include exposing the dielectric layer 302 to nitrogen plasma in the same deposition chamber that dielectric layer 302 is deposited. For example, a nitrogen remote-plasma is exposed to dielectric layer 302 to form nitrogen-containing dielectric layer 304 directly in process chamber configured with a remote-plasma device, such as an ALD chamber or a CVD chamber. Radical nitrogen compounds may also be produced by heat or hot-wires and used during nitridation processes.

Other nitridation processes to form nitrogen-containing dielectric layer 304 are contemplated, such as annealing the substrate in a nitrogen-containing environment, and/or including a nitrogen precursor into an additional half reaction within the ALD cycle while forming the nitrogen-containing dielectric layer 304. For example, an additional half reaction during an ALD cycle to form hafnium silicate may include a pulse of $NH_3$ followed by a pulse of purge gas.

In one embodiment depicted in FIGS. 3A-3K, the optional anneal process is executed during step 106. The substrate is transferred to an anneal chamber, such as the CENTURA™ RADIANCE™ RTP chamber available from Applied Materials, Inc., located in Santa Clara, Calif., and exposed to an anneal process. The anneal chamber may be on the same cluster tool as the deposition chamber and/or the nitridation chamber. Therefore, the substrate may be annealed without being exposed to the ambient environment. The substrate is maintained at a temperature from about 600° C. to about 1,200° C. for a time period from about 1 second to about 120 seconds, for example, at about 1,000° C. for about 15 seconds. Generally, the process chamber atmosphere contains at least one anneal gas, such as $O_2$, $N_2$, $NH_3$, $N_2H_4$, NO, $N_2O$, or combinations thereof. The chamber is maintained at a pressure from about 1 Torr to about 100 Torr, for example, about 5 Torr.

Figure 3D:
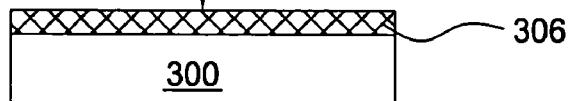

The anneal process converts nitrogen-containing dielectric layer 304 to dielectric nitride material layers 306, as depicted in FIG. 3D. The anneal process repairs any damage caused by plasma bombardment during step 104 and reduces the fixed charge of nitrogen-containing dielectric layer 304. In step 108, the predetermined thickness of dielectric material is decided. If, after one cycle of steps 102-106, the predetermined layer thickness of the dielectric material is achieved, then process 100 skips the optional anneal process during step 110 and is ended during step 112. However, in the preferred embodiment, the dielectric material thickness is not achieved after only one cycle of steps 102-106 and therefore is repeated.

Figure 3E:
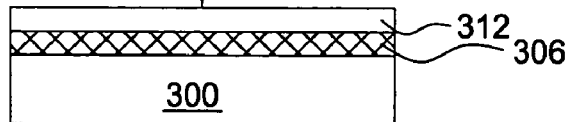
Figure 3F:
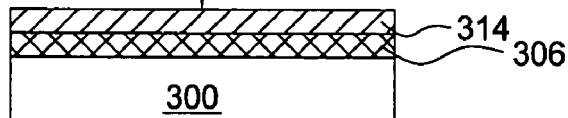
Figure 3G:
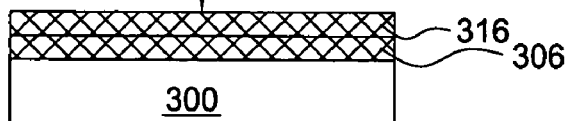
Figure 3H:
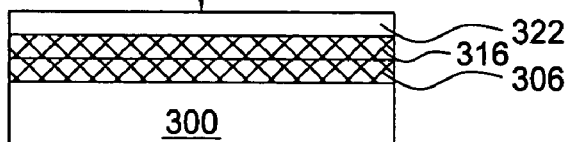
Figure 3I:
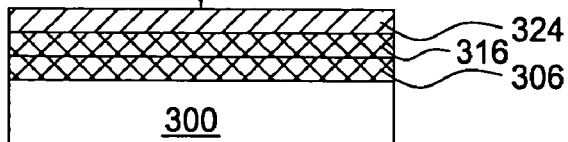
Figure 3J:
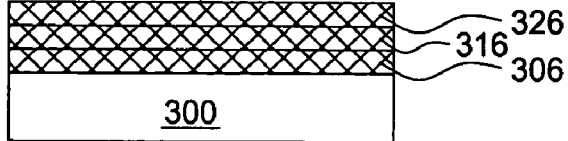

In FIG. 3E, dielectric layer 312 is deposited on dielectric nitride layer 306 by the same process as discussed in step 102. The layer thickness of dielectric layer 312 does not have to be the same thickness as dielectric layer 302, but generally have similar thicknesses. In FIG. 3F, dielectric layer 312 is exposed to a nitridation process as discussed in step 104 to form nitrogen-containing dielectric layer 314. In FIG. 3G, the substrate is exposed to an anneal process as discussed in step 106 to convert nitrogen-containing dielectric layer 314 to dielectric nitride layer 316. In FIG. 3H, dielectric layer 322 is deposited on dielectric nitride layer 316 by the same process as discussed in step 102. In FIG. 3I, dielectric layer 322 is exposed to a nitridation process as discussed in step 104 to form nitrogen-containing dielectric layer 324. In FIG. 3J, the substrate is exposed to an anneal process in step 106 to convert nitrogen-containing dielectric layer 324 to dielectric nitride layer 326. Steps 102-106 may be repeated to form the predetermined thickness of the dielectric material.

Figure 3K:
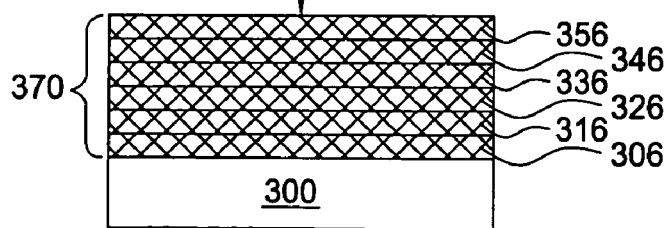

FIG. 3K depicts dielectric material or stack 370 of dielectric nitride material layers 306, 316, 326, 336, 346 and 356 after steps 102-106 have been performed six times. Each of the dielectric nitride material layers 306, 316, 326, 336, 346 and 356 may have a film thickness from about 1 Å to about 50 Å, preferably from about 5 Å to about 30 Å and more preferably from about 5 Å to about 20 Å, for example, about 15 Å. Dielectric material or stack 370 generally has a thickness from about 10 Å to about 250 Å, preferably from about 20 Å to about 100 Å, for example, 60 Å. In one embodiment, dielectric material or stack 370 has a thickness 60 Å or less.

Although FIGS. 2I and 3k depict stacks 270 and 370 containing six dielectric nitride material layers, numerous layers may be deposited in order to form a dielectric material. A dielectric material may have as few as two layers or hundreds of layers. For example, a dielectric material formed with an overall thickness of about 60 Å may include twelve 5 Å dielectric layers, six 10 Å dielectric layers, four 15 Å dielectric layers, three 20 Å dielectric layers or two 30 Å dielectric layers, among others. In another example, a dielectric material formed with an overall thickness of about 100 Å may include twenty 5 Å dielectric layers, ten 10 Å dielectric layers, five 20 Å dielectric layers, four 25 Å dielectric layers or two 50 Å dielectric layers, among others. Dielectric material remains amorphous and may have a nitrogen concentration in the range from about 5 at % to about 25 at %, preferably from about 10 at % to about 20 at %, for example, about 15 at %.

As described above, dielectric material or stack 270 is formed by annealing the substrate after the desired number of dielectric layers is deposited or after the predetermined film thickness is achieved. Alternatively, dielectric material or stack 370 is formed by annealing the substrate after each nitridation of the dielectric layers. In another embodiment, the optional anneal process of step 106 may be applied during a cycle of steps 102-106 and omitted during another cycle of steps 102-106 during the formation of a dielectric material. Routine experimentation may be conducted to determine the correct intervals of exposing the substrate to the anneal process. Some variables that direct the annealing intervals include the specific nitridation technique used during the nitridation process, thickness and composition of dielectric layers and desired characteristics of the final dielectric material.

Nitrogen Stabilization of Dielectric Material

Figure 4:
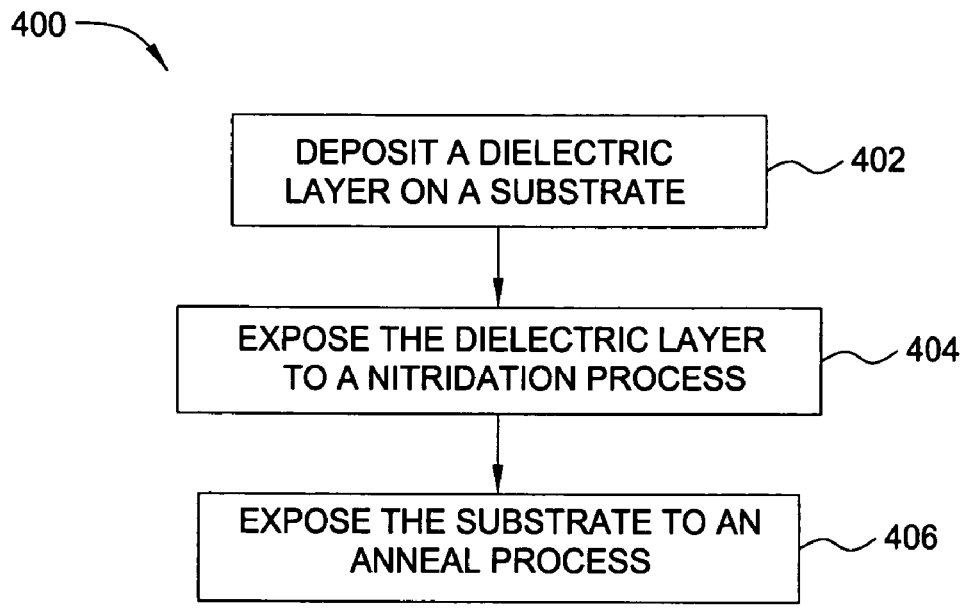
FIG. 4 illustrates a process sequence for forming a dielectric material according to another embodiment described herein.

In FIG. 4, illustrates an exemplary process 400 for forming a dielectric material, such as a hafnium oxynitride material or a tantalum oxynitride material. FIGS. 5A-5D correspond to process 400 to illustrate the formation of a dielectric material used in of a semiconductor device, such as a transistor and/or capacitor. Dielectric layer 502, disposed on substrate 500, is exposed to a nitridation process to form nitrogen-containing dielectric layer 504. Subsequently, nitrogen-containing dielectric layer 504 is converted to dielectric nitride dielectric layer 506 by exposure to an anneal process.

Figure 5A:
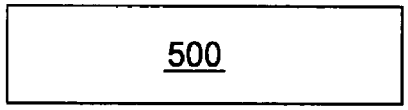
FIGS. 5A-5D illustrate a process sequence for forming multiple layers on a substrate surface according to another embodiment described herein.
Figure 5B:
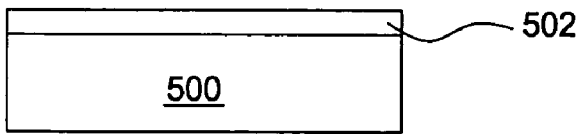

In one embodiment of process 400, a dielectric layer 502 is deposited on a substrate 500, during step 402, by conventional deposition techniques, such as ALD, CVD, PVD, thermal techniques and combinations thereof, as depicted in FIGS. 5A-5B. In a preferred embodiment, dielectric layer 502 is deposited by an ALD process and apparatus, such as described in co-pending United States Provisional Patent Application Serial No. unknown, filed May 12, 2004, entitled, "Atomic Layer Deposition of Hafnium-containing High-K Materials," assigned to Applied Materials, Inc., and is herein incorporated by reference. Dielectric layer 502 is generally deposited with a film thickness from about 5 Å to about 300 Å, preferably from about 10 Å to about 200 Å and more preferably from about 10 Å to about 100 Å, for example, about 50 Å.

A substrate may be pretreated before depositing dielectric layer 502 in order to have termination with a variety of functional groups such as hydroxyls (OH), alkoxy (OR, where R=Me, Et, Pr or Bu), haloxyls (OX, where X=F, Cl, Br or I), halides (F, Cl, Br or I), oxygen radicals, aminos (NH or $NH_2$) and amidos (NR or $NR_2$, where R=H, Me, Et, Pr or Bu). A pretreatment is especially useful prior to depositing dielectric layer 502 with an ALD process or a CVD process. A pretreatment may be effected by administering a reagent, such as $NH_3$, $B_2H_6$, $SiH_4$, $Si_2H_6$, $H_2O$, HF, HCl, $O_2$, $O_3$, $H_2O$, $H_2O/O_2$, $H_2O/H_2$, $H_2O_2$, $H_2$, atomic-H, atomic-N, atomic-O, alcohols or amines. Once the surface of the substrate is pretreated, an ALD cycle is started. For many of the high-k dielectric materials, the precursor adsorption is self-limiting under certain process conditions, and generally is at low temperatures (<300° C.) to exhibit this behavior. In one embodiment, the pretreatment may involve a presoak with a reagent prior to depositing a hafnium compound. The presoak may involve exposing the substrate surface to the reagent for a period of time from about 5 seconds to about 120 seconds, preferably from about 5 seconds to about 30 seconds. In one example, the substrate surface is exposed to water for about 15 seconds prior to starting an ALD process to deposit dielectric layer 502.

Dielectric layer 502 is deposited on the substrate surface and may have a variety of compositions that are homogenous, heterogeneous, graded and/or multiple layered stacks or laminates. Dielectric layer 502 is generally a high-k dielectric material and includes combinations of hafnium, zirconium, titanium, tantalum, lanthanum, aluminum, oxygen and/or nitrogen. Often a metal oxide or a metal oxynitride is used as dielectric layer 502. Although some silicon diffusion into dielectric layer 502 may occur from the substrate, dielectric layer 502 is usually substantially free of silicon. Dielectric layer 502 may have a composition that includes hafnium-containing materials, such as hafnium oxides ($HfO_x$ or $HfO_2$), hafnium oxynitrides ($HfO_xN_y$), hafnium aluminates ($HfAl_xO_y$), hafnium lanthanum oxides ($HfLa_xO_y$), zirconium-containing materials, such as zirconium oxides ($ZrO_x$ or $ZrO_2$), zirconium oxynitrides ($ZrO_xN_y$), zirconium aluminates ($ZrAl_xO_y$), zirconium lanthanum oxides ($ZrLa_xO_y$), other aluminum-containing materials or lanthanum-containing materials, such as aluminum oxides ($Al_2O_3$ or $AlO_x$), aluminum oxynitrides ($AlO_xN_y$), lanthanum aluminum oxides ($LaAl_xO_y$), lanthanum oxides ($LaO_x$ or $La_2O_3$), derivatives thereof and combinations thereof. Other dielectric materials useful for dielectric layer 502 may include titanium oxides ($TiO_x$ or $TiO_2$), titanium oxynitrides ($TiO_xN_y$), tantalum oxides ($TaO_x$ or $Ta_2O_5$) and tantalum oxynitrides ($TaO_xN_y$). Laminate films that are useful dielectric materials for dielectric layer 502 include $HfO_2/Al_2O_3$, $La_2O_3Al_2O_3$ and $HfO_2/La_2O_3/Al_2O_3$.

Figure 5C:
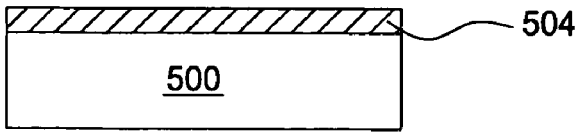

In step 404, the dielectric layer 502 is exposed to a nitridation process that physically incorporates nitrogen atoms into the dielectric to form nitrogen-containing dielectric layer 504, as depicted in FIG. 5C. The nitridation process may include decoupled plasma nitridation (DPN), remote plasma nitridation, hot-wired induced atomic-N, and nitrogen incorporation during dielectric deposition (e.g., during ALD or CVD processes). The nitrogen-containing dielectric layer 504 is usually nitrogen-rich at the surface. The nitrogen concentration of nitrogen-containing dielectric layer 504 may be in the range from about 5 at % to about 40 at %, preferably from about 10 at % to about 25 at %. Preferably, the nitridation process exposes the dielectric layer 502 to nitrogen plasma, such as a DPN process.

In one embodiment, the substrate is transferred to a DPN chamber, such as the CENTURA™ DPN chamber, available from Applied Materials, Inc., located in Santa Clara, Calif. In one aspect, the DPN chamber is on the same cluster tool as the ALD chamber used to deposit the dielectric layer 502. Therefore, the substrate may be exposed to a nitridation process without being exposed to the ambient environment. During a DPN process, the dielectric layer 502 is bombarded with atomic-N formed by co-flowing $N_2$ and a noble gas plasma, such as argon. Besides $N_2$, other nitrogen-containing gases may be used to form the nitrogen plasma, such as NH$_3$, hydrazines (e.g., N$_2$H$_4$ or MeN$_2$H$_3$), amines (e.g., Me$_3$N, Me$_2$NH or MeNH$_2$), anilines (e.g., C$_6$H$_5$NH$_2$), and azides (e.g., MeN$_3$ or Me$_3$SiN$_3$). Other noble gases that may be used in a plasma process include helium, neon and xenon. The nitridation process proceeds at a time period from about 10 seconds to about 120 seconds, preferably from about 15 seconds to about 60 seconds, for example, about 30 seconds. Also, the nitridation process is conducted at a plasma power setting from about 900 watts to about 2,700 watts and a pressure at about 10 mTorr to about 100 mTorr. The nitrogen has a flow from about 0.1 slm to about 1.0 slm, while the noble gas has a flow from about 0.1 slm to about 1.0 slm. In a preferred embodiment, the nitridation process is a DPN process and includes a plasma by co-flowing Ar and N$_2$.

In another embodiment, instead of transferring the substrate to the DPN chamber, a nitridation process may include exposing the dielectric layer 502 to nitrogen plasma in the same deposition chamber that dielectric layer 502 is deposited. For example, a nitrogen remote-plasma is exposed to dielectric layer 502 to form nitrogen-containing dielectric layer 504 directly in process chamber configured with a remote-plasma device, such as an ALD chamber or a CVD chamber. Radical nitrogen compounds may also be produced by heat or hot-wires and used during nitridation processes. Other nitridation processes to form nitrogen-containing dielectric layer 504 are contemplated, such as annealing the substrate in a nitrogen-containing environment, and/or including a nitrogen precursor into an additional half reaction within the ALD cycle while forming the nitrogen-containing dielectric layer 504. For example, an additional half reaction during an ALD cycle to form hafnium oxide may include a pulse of NH$_3$ followed by a pulse of purge gas.

In step 406, the substrate is exposed to an anneal process. In one embodiment, the substrate is transferred to an anneal chamber, such as the CENTURA™ RADIANCE™ RTP chamber available from Applied Materials, Inc., located in Santa Clara, Calif., and exposed to an anneal process. The anneal chamber may be on the same cluster tool as the deposition chamber and/or the nitridation chamber. Therefore, the substrate may be annealed without being exposed to the ambient environment. The substrate is maintained at a temperature from about 600° C. to about 1,200° C. for a time period from about 1 second to about 120 seconds, for example, at about 1,000° C. for about 60 seconds. Generally, the process chamber atmosphere contains at least one anneal gas, such as O$_2$, N$_2$, NH$_3$, N$_2$H$_4$, NO, N$_2$O, or combinations thereof. The chamber is maintained at a pressure from about 5 Torr to about 100 Torr, for example, at about 5 Torr.

Figure 5D:

The anneal process converts nitrogen-containing dielectric layer 504 to the dielectric material or dielectric nitride layer 506, as depicted in FIG. 5D. The anneal process repairs any damage caused by plasma bombardment during step 404 and reduces the fixed charge of dielectric nitride layer 506. Dielectric material remains amorphous and may have a nitrogen concentration in the range from about 5 at % to about 25 at %, preferably from about 10 at % to about 20 at %, for example, about 15 at %. Dielectric nitride layer 506 has a film thickness from about 5 Å to about 300 Å, preferably from about 10 Å to about 200 Å and more preferably from about 10 Å to about 100 Å, for example, about 50 Å.

EXAMPLES

Example 1

A substrate is placed into an ALD chamber and the substrate surface is exposed to a pretreatment to form hydroxyl groups. A hafnium silicate layer is deposited on the substrate surface by performing an ALD process using the hafnium precursor (HfCl$_4$), the silicon precursor (TDMAS), and in-situ water vapor produced by a water vapor generator (WVG) system, available from Fujikin of America, Inc., located in Santa Clara, Calif. The ALD cycle includes sequentially pulsing HfCl$_4$, water vapor, TDMAS and water vapor, with each precursor separated by a nitrogen purge cycle. The ALD cycle is repeated ten times to form a hafnium silicate layer with a thickness of about 4 Å.

The substrate is transferred to a decoupled plasma nitridation (DPN) chamber, such as the CENTURA™ DPN chamber, available from Applied Materials, Inc., located in Santa Clara, Calif. The substrate surface is exposed to a nitridation process by co-flowing N$_2$ with an argon plasma. The nitridation process proceeds for about 10 seconds to incorporate nitrogen atoms within the hafnium silicate layer. The substrate is subsequently transferred to an anneal chamber, such as the CENTURA™ RADIANCE™ RTP chamber available from Applied Materials, Inc., located in Santa Clara, Calif., and exposed to an anneal process. The substrate is maintained at about 1,000° C. for about 15 seconds in an O$_2$ atmosphere maintained at about 15 Torr. The incorporated nitrogen atoms form bonds with the hafnium silicate to produce hafnium silicon oxynitride. The process cycle containing the ALD process, the nitridation process and the anneal process is repeated fifteen times to form a hafnium silicon oxynitride layer with a thickness of about 60 Å.

Example 2

A substrate is placed into an ALD chamber equipped with a remote plasma generator and the substrate surface is exposed to a pretreatment to form hydroxyl groups. A hafnium silicate layer is deposited on the substrate surface by performing an ALD process using the hafnium precursor (TDEAH), the silicon precursor (Tris-DMAS), and in-situ water vapor produced by a water vapor generator (WVG) system, available from Fujikin of America, Inc., located in Santa Clara, Calif. The ALD cycle includes co-flowing TDEAH and Tris-DMAS in a first half reaction and sequentially pulsing water vapor in a second half reaction, with each half reaction separated by an argon purge. The hafnium silicate layer is formed by repeating the cycle ten times until the film has a thickness of about 4 Å.

The ALD process is stopped and the substrate is kept in the ALD chamber equipped with a remote plasma generator. The substrate surface is exposed to a remote plasma nitridation process for about 10 seconds to incorporate nitrogen atoms within the hafnium silicate layer. The substrate is subsequently transferred to an anneal chamber, such as the CENTURA™ RADIANCE™ RTP chamber available from Applied Materials, Inc., located in Santa Clara, Calif., and exposed to an anneal process. The substrate is maintained at about 1,000° C. for about 15 seconds in an O$_2$ atmosphere maintained at about 15 Torr. The incorporated nitrogen atoms form bonds with the hafnium silicate to produce hafnium silicon oxynitride. The process cycle containing the ALD process, the nitridation process and the anneal process is repeated fifteen times to form a hafnium silicon oxynitride layer with a thickness of about 60 Å.

Example 3

A substrate is placed into an ALD chamber and the substrate surface is exposed to a pretreatment to form hydroxyl groups. A tantalum oxide layer is deposited on the substrate surface by performing an ALD process using the tantalum precursor (TaCl$_5$) and water. The ALD cycle includes sequentially pulsing TaCl$_5$ and water vapor with each precursor separated by a nitrogen purge cycle. The ALD cycle is repeated eight times to form a tantalum oxide layer with a thickness of about 5 Å.

The substrate is transferred to a decoupled plasma nitridation (DPN) chamber, such as the CENTURA™ DPN chamber, available from Applied Materials, Inc., located in Santa Clara, Calif. The substrate surface is exposed to a nitridation process by co-flowing N$_2$ with an argon plasma. The nitridation process proceeds for about 10 seconds to incorporate nitrogen atoms within the tantalum oxide layer. The substrate is subsequently transferred to an anneal chamber, such as the CENTURA™ RADIANCE™ RTP chamber available from Applied Materials, Inc., located in Santa Clara, Calif., and exposed to an anneal process. The substrate is maintained at about 1,000° C. for about 15 seconds in an O$_2$ atmosphere maintained at about 15 Torr. The incorporated nitrogen atoms form bonds with the tantalum oxide to produce tantalum oxynitride. The process cycle containing the ALD process, the nitridation process and the anneal process is repeated twenty times to form a tantalum oxynitride layer with a thickness of about 100 Å.

Example 4

A substrate is placed into an ALD chamber equipped with a remote plasma generator and the substrate surface is exposed to a pretreatment to form hydroxyl groups. A tantalum oxide layer is deposited on the substrate surface by performing an ALD process using the tantalum precursor (TaCl$_5$) and water. The ALD cycle includes sequentially pulsing TaCl$_5$ and water vapor with each precursor separated by a nitrogen purge cycle. The ALD cycle is repeated eight times to form a tantalum oxide layer with a thickness of about 5 Å.

The ALD process is stopped and the substrate is kept in the ALD chamber equipped with a remote plasma generator. The substrate surface is exposed to a remote plasma nitridation process for about 10 seconds to incorporate nitrogen atoms within the tantalum oxide layer. The substrate is subsequently transferred to an anneal chamber, such as the CENTURA™ RADIANCE™ RTP chamber available from Applied Materials, Inc., located in Santa Clara, Calif., and exposed to an anneal process. The substrate is maintained at about 1,000° C. for about 15 seconds in an O$_2$ atmosphere maintained at about 15 Torr. The incorporated nitrogen atoms form bonds with the tantalum oxide to produce tantalum oxynitride. The process cycle containing the ALD process, the nitridation process and the anneal process is repeated ten times to form a tantalum oxynitride layer with a thickness of about 50 Å.

Example 5

A substrate is placed into an ALD chamber and the substrate surface is exposed to a pretreatment to form hydroxyl groups. A hafnium silicate layer is deposited on the substrate surface by performing an ALD process using the hafnium precursor (HfCl$_4$), the silicon precursor (TDMAS), and in-situ water vapor produced by a water vapor generator (WVG) system, available from Fujikin of America, Inc., located in Santa Clara, Calif. The ALD cycle includes sequentially pulsing HfCl$_4$, water vapor, TDMAS and water vapor, with each precursor separated by a nitrogen purge cycle. The ALD cycle is repeated ten times to form a hafnium silicate layer with a thickness of about 4 Å.

The substrate is transferred to a decoupled plasma nitridation (DPN) chamber, such as the CENTURA™ DPN chamber, available from Applied Materials, Inc., located in Santa Clara, Calif. The substrate surface is exposed to a nitridation process by co-flowing N$_2$ with an argon plasma. The nitridation process proceeds for about 10 seconds to incorporate nitrogen atoms within the hafnium silicate layer. The process cycle containing the ALD process and the nitridation process is repeated fifteen times to form a nitrated hafnium silicate layer with a thickness of about 60 Å.

The substrate is subsequently transferred to an anneal chamber, such as the CENTURA™ RADIANCE™ RTP chamber available from Applied Materials, Inc., located in Santa Clara, Calif., and exposed to an anneal process. The substrate is maintained at about 1,000° C. for about 60 seconds in an O$_2$ atmosphere maintained at about 15 Torr. The incorporated nitrogen atoms form bonds with the hafnium silicate to produce hafnium silicon oxynitride.

Example 6

A substrate is placed into an ALD chamber and the substrate surface is exposed to a pretreatment to form hydroxyl groups. A tantalum oxide layer is deposited on the substrate surface by performing an ALD process using the tantalum precursor (TaCl$_5$) and water. The ALD cycle includes sequentially pulsing TaCl$_5$ and water vapor with each precursor separated by a nitrogen purge cycle. The ALD cycle is repeated eight times to form a tantalum oxide layer with a thickness of about 12 Å.

The substrate is transferred to a decoupled plasma nitridation (DPN) chamber, such as the CENTURA™ DPN chamber, available from Applied Materials, Inc., located in Santa Clara, Calif. The substrate surface is exposed to a nitridation process by co-flowing N$_2$ with an argon plasma. The nitridation process proceeds for about 10 seconds to incorporate nitrogen atoms within the tantalum oxide layer. The process cycle containing the ALD process and the nitridation process is repeated ten times to form a nitrided tantalum oxide layer with a thickness of about 120 Å.

The substrate is subsequently transferred to an anneal chamber, such as the CENTURA™ RADIANCE™ RTP chamber available from Applied Materials, Inc., located in Santa Clara, Calif. and exposed to an anneal process. The substrate is maintained at about 1,000° C. for about 60 seconds in an O$_2$ atmosphere maintained at about 15 Torr. The incorporated nitrogen atoms form bonds with the tantalum oxide to produce tantalum oxynitride.

Example 7

A substrate is placed into an ALD chamber and the substrate surface is exposed to a pretreatment to form hydroxyl groups. A hafnium oxide layer is deposited on the substrate surface by performing an ALD process using the hafnium precursor (HfCl$_4$) and water. The ALD cycle includes sequentially pulsing HfCl$_4$ and water vapor with each precursor separated by a nitrogen purge cycle. The ALD cycle is repeated until a hafnium oxide layer was deposited with a thickness of about 75 Å.

The substrate is transferred to a decoupled plasma nitridation (DPN) chamber, such as the CENTURA™ DPN chamber, available from Applied Materials, Inc., located in Santa Clara, Calif. The substrate surface is exposed to a nitridation process by co-flowing N$_2$ with an argon plasma. The nitridation process proceeds for about 30 seconds to incorporate nitrogen atoms within the hafnium oxide layer. The substrate is subsequently transferred to an anneal chamber, such as the CENTURA™ RADIANCE™ RTP chamber available from Applied Materials, Inc., located in Santa Clara, Calif., and exposed to an anneal process. The substrate is maintained at about 1,000° C. for about 45 seconds in an $O_2$ atmosphere maintained at about 15 Torr. The incorporated nitrogen atoms form bonds with the hafnium oxide to produce hafnium oxynitride.

Example 8

A substrate is placed into an ALD chamber and the substrate surface is exposed to a pretreatment to form hydroxyl groups. A tantalum oxide layer is deposited on the substrate surface by performing an ALD process using the tantalum precursor ($TaCl_5$) and water. The ALD cycle includes sequentially pulsing $TaCl_5$ and water vapor with each precursor separated by a nitrogen purge cycle. The ALD cycle is repeated until a tantalum oxide layer was deposited with a thickness of about 85 Å.

The substrate is transferred to a decoupled plasma nitridation (DPN) chamber, such as the CENTURA™ DPN chamber, available from Applied Materials, Inc., located in Santa Clara, Calif. The substrate surface is exposed to a nitridation process by co-flowing $N_2$ with an argon plasma. The nitridation process proceeds for about 30 seconds to incorporate nitrogen atoms within the tantalum oxide layer. The substrate is subsequently transferred to an anneal chamber, such as the CENTURA™ RADIANCE™ RTP chamber available from Applied Materials, Inc., located in Santa Clara, Calif. and exposed to an anneal process. The substrate is maintained at about 1,000° C. for about 45 seconds in an $O_2$ atmosphere maintained at about 15 Torr. The incorporated nitrogen atoms form bonds with the tantalum oxide to produce tantalum oxynitride.

Example 9

Comparison Example

Hafnium oxide was deposited on Substrates A and B under the identical process conditions. Substrate A was placed into a DPN chamber, such as the CENTURA™ DPN chamber, available from Applied Materials, Inc., located in Santa Clara, Calif., and exposed to a nitridation process. Subsequently, Substrate A was placed into an anneal chamber, such as the CENTURA™ RADIANCE™ RTP chamber available from Applied Materials, Inc., located in Santa Clara, Calif., and exposed to an anneal process. Substrate B was not exposed to a nitridation process or an anneal process. Current leakage was measured on both surfaces to reveal Substrate A had a current density a magnitude lower than Substrate B, although both substrates had similar EOTs (effective oxide thickness). Furthermore, Substrate A, having already been annealed, is thermal more stable than Substrate B, which will crystallize upon exposure to elevated temperatures experienced in subsequent fabrication processes.

While the foregoing is directed to embodiments of the present invention, other and further embodiments of the invention may be devised without departing from the basic scope thereof, and the scope thereof is determined by the claims that follow.

The invention claimed is:

1. A method for forming a dielectric stack on a substrate, comprising:
   depositing a first dielectric layer of hafnium silicate on a substrate by an atomic layer deposition process, wherein the substrate is exposed to precursors of an alkylamino hafnium compound, water vapor, and an alkylamino silane compound during the atomic layer deposition process;
   exposing the first dielectric layer to a plasma nitridation process to form a first nitride layer comprising a nitrogen concentration within a range from about 5 at % to about 25 at %;
   depositing a second dielectric layer on the first nitride layer, wherein the second dielectric layer comprises a material selected from the group consisting of hafnium silicate, zirconium silicate, aluminum silicate, derivatives thereof, and combinations thereof;
   exposing the second dielectric layer to the plasma nitridation process to form a second nitride layer comprising a nitrogen concentration within a range from about 5 at % to about 25 at %; and
   exposing the substrate to an annealing process, wherein the depositing the first dielectric layer of hafnium silicate further comprises co-flowing the alkylamino hafnium compound and the alkylamino silane compound in a first half reaction and sequentially pulsing the water vapor in a second half reaction, with each half reaction separated by an argon purge.

2. A method for forming a dielectric stack on a substrate, comprising:
   a) depositing a dielectric layer having a thickness within a range from about 5 Å to about 50 Å on a substrate by an atomic layer deposition process, wherein the dielectric layer comprises a dielectric material consisting of hafnium silicate from precursors of an alkylamino hafnium compound, water vapor, and an alkylamino silane compound;
   b) exposing the dielectric layer to a plasma nitridation process to form a nitride layer thereon, wherein the dielectric layer comprises a nitrogen concentration within a range from about 5 at % to about 25 at %;
   c) optionally exposing the substrate to an annealing process; and
   d) repeating a process cycle of at least a)-b) to form the dielectric stack, wherein the depositing the dielectric layer further comprises co-flowing the alkylamino hafnium compound and the alkylamino silane compound in a first half reaction and sequentially pulsing the water vapor in a second half reaction, with each half reaction separated by an argon purge.

3. A method for forming a dielectric stack on a substrate, comprising:
   a) depositing a dielectric layer of hafnium silicate on the substrate by an atomic layer deposition process, wherein the substrate is exposed to an alkylamino hafnium compound, water vapor, and alkylamino silane compound during the atomic layer deposition process;
   b) exposing the dielectric layer to a plasma nitridation process;
   c) exposing the substrate to an annealing process; and
   d) repeating a process cycle of steps a-c to form the dielectric stack, wherein the depositing the dielectric layer of hafnium silicate further comprises co-flowing the alkylamino hafnium compound and the alkylamino silane compound in a first half reaction and sequentially pulsing the water vapor in a second half reaction, with each half reaction separated by an argon purge.

4. A method for forming a dielectric stack on a substrate, comprising:
   a) depositing a dielectric layer of hafnium silicate on the substrate by an atomic layer deposition process, wherein the hafnium silicate is formed from precursors of alkylamino hafnium, water vapor, and alkylamino silane;
b) exposing the dielectric layer to a plasma nitridation process; and
c) repeating a process cycle of steps a-b to form the dielectric stack, wherein the dielectric stack comprises a nitrogen concentration within a range from about 5 at % to about 25 at %, wherein the depositing the dielectric layer of hafnium silicate further comprises co-flowing the alkylamino hafnium compound and the alkylamino silane compound in a first half reaction and sequentially pulsing the water vapor in a second half reaction, with each half reaction separated by an argon purge.

5. A method for forming a dielectric nitride material on a substrate, comprising:
depositing a dielectric layer of hafnium silicate on a substrate by an atomic layer deposition process, wherein the substrate is exposed to an alkylamino hafnium compound, water vapor, and an alkylamino silane compound during the atomic layer deposition process;
exposing the dielectric layer to a plasma nitridation process to form a nitride layer thereon, wherein the nitride layer comprises a nitrogen concentration within a range from about 5 at % to about 25 at %; and
exposing the nitride layer to an annealing process, wherein the depositing the dielectric layer of hafnium silicate further comprises co-flowing the alkylamino hafnium compound and the alkylamino silane compound in a first half reaction and sequentially pulsing the water vapor in a second half reaction, with each half reaction separated by an argon purge.

6. A method for forming a dielectric material on a substrate, comprising:
depositing a metal oxide layer on a substrate during an atomic layer deposition process, wherein the metal oxide layer comprises hafnium silicate, wherein the substrate is exposed to an alkylamino hafnium compound, water vapor, and an alkylamino silane compound during the atomic layer deposition process;
exposing the metal oxide layer to a plasma nitridation process to form a nitride layer thereon; and
exposing the substrate sequentially to the deposition and nitridation processes while periodically exposing the substrate to an annealing process to form a dielectric stack having a predetermined thickness, wherein the depositing the metal oxide layer further comprises co-flowing the alkylamino hafnium compound and the alkylamino silane compound in a first half reaction and sequentially pulsing the water vapor in a second half reaction, with each half reaction separated by an argon purge.

* * * * *